United States Patent
Sato et al.

(10) Patent No.: US 10,348,986 B2
(45) Date of Patent: Jul. 9, 2019

(54) SOLID-STATE IMAGE SENSOR, ELECTRONIC APPARATUS, AND CONTROL METHOD OF SOLID-STATE IMAGE SENSOR

(71) Applicant: Sony Corporation, Tokyo (JP)

(72) Inventors: Mamoru Sato, Kanagawa (JP); Akihiko Kato, Tokyo (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 15/873,337

(22) Filed: Jan. 17, 2018

(65) Prior Publication Data

US 2018/0146154 A1 May 24, 2018

Related U.S. Application Data

(63) Continuation of application No. 15/738,614, filed as application No. PCT/JP2017/007397 on Feb. 27, 2017.

(30) Foreign Application Priority Data

Apr. 15, 2016 (JP) .................................. 2016-081956

(51) Int. Cl.
*H04N 5/359* (2011.01)
*H04N 5/374* (2011.01)
(Continued)

(52) U.S. Cl.
CPC ......... *H04N 5/3598* (2013.01); *H01L 27/146* (2013.01); *H01L 27/14609* (2013.01);
(Continued)

(58) Field of Classification Search
CPC ...... H04N 5/3598; H04N 5/351; H04N 5/359; H04N 5/374; H04N 5/37457; H04N 5/378;
(Continued)

(56) References Cited

U.S. PATENT DOCUMENTS 9,325,922 B2 * 4/2016 Ohya ................. H04N 5/37455
2007/0080376 A1 4/2007 Adachi et al.
(Continued)

FOREIGN PATENT DOCUMENTS

JP 2006-238283 A 9/2006
JP 2007-104240 A 4/2007
(Continued)

OTHER PUBLICATIONS

U.S. Appl. No. 15/738,614, filed Dec. 21, 2017, Sato et al.
(Continued)

*Primary Examiner* — Twyler L Haskins
*Assistant Examiner* — Fayez Bhuiyan
(74) *Attorney, Agent, or Firm* — Wolf, Greenfield & Sacks, P.C.

(57) ABSTRACT

To prevent the black dot phenomenon from occurring in a differential amplification-type solid-state image sensor.
A signal-side amplifier transistor generates an output voltage corresponding to a signal current corresponding to one of a pair of differential input voltages by supplying the signal current from an output node to a common-phase node. A reference-side amplifier transistor supplies a reference current corresponding to the other one of the pair of differential input voltages to the common-phase node. A constant current source constantly controls a sum of the signal current and the reference current to be merged at the common-phase node. A bypass control unit connects the output node and the common-phase node and supplies the signal current having a value corresponding to a predetermined limit voltage to the common-phase node in a case in which the output voltage reaches the limit voltage.

28 Claims, 17 Drawing Sheets

(51) Int. Cl.
 *H04N 5/378* (2011.01)
 *H01L 27/146* (2006.01)
 *H04N 5/351* (2011.01)
 *H04N 5/3745* (2011.01)

(52) U.S. Cl.
 CPC ....... *H01L 27/14643* (2013.01); *H04N 5/351* (2013.01); *H04N 5/359* (2013.01); *H04N 5/374* (2013.01); *H04N 5/378* (2013.01); *H04N 5/37457* (2013.01)

(58) Field of Classification Search
 CPC ............. H01L 27/146; H01L 27/14609; H01L 27/14643
 See application file for complete search history.

(56) References Cited

U.S. PATENT DOCUMENTS

| | | |
|---|---|---|
| 2009/0009635 A1 | 1/2009 | Maeda et al. |
| 2010/0091160 A1 | 4/2010 | Murakami |
| 2010/0149366 A1 | 6/2010 | Noda et al. |
| 2014/0027617 A1 | 1/2014 | Amikawa |
| 2016/0373673 A1* | 12/2016 | Okura ................ H04N 5/3598 |
| 2018/0184023 A1 | 6/2018 | Sato et al. |

FOREIGN PATENT DOCUMENTS

| | | |
|---|---|---|
| JP | 2007-195033 A | 8/2007 |
| JP | 2008-271280 A | 11/2008 |
| JP | 2008-283557 A | 11/2008 |
| JP | 2010-093698 A | 4/2010 |
| JP | 2010-141848 A | 6/2010 |
| WO | WO 2012/144181 A1 | 10/2012 |

OTHER PUBLICATIONS

International Search Report and English translation thereof dated May 16, 2017 in connection with International Application No. PCT/JP2017/007397.

Written Opinion and English translation thereof dated May 16, 2017 in connection with International Application No. PCT/JP2017/007397.

* cited by examiner

SOLID-STATE IMAGE SENSOR, ELECTRONIC APPARATUS, AND CONTROL METHOD OF SOLID-STATE IMAGE SENSOR

CROSS REFERENCE TO RELATED APPLICATIONS

This application is a continuation of and claims the benefit under 35 U.S.C. § 120 of U.S. patent application Ser. No. 15/738,614, titled "SOLID-STATE IMAGE SENSOR, ELECTRONIC APPARATUS, AND CONTROL METHOD OF SOLID-STATE IMAGE SENSOR," filed on Dec. 21, 2017, which claims the benefit under 35 U.S.C. § 371 as a U.S. National Stage Entry of International Application No. PCT/JP2017/007397, filed in the Japanese Patent Office as a Receiving Office on Feb. 27, 2017, which claims priority to Japanese Patent Application Number JP2016-081956, filed in the Japanese Patent Office on Apr. 15, 2016, each of which is hereby incorporated by reference in its entirety.

TECHNICAL FIELD

The present technology relates to a solid-state image sensor, an electronic apparatus, and a control method of the solid-state image sensor. Specifically, the technology relates to a differential amplification-type solid-state image sensor, an electronic apparatus, and a control method of the solid-state image sensor.

BACKGROUND ART

Solid-state image sensors which produce image data by photoelectrically converting light have been used in imaging devices since the past. A differential amplification-type image sensor that amplifies differential signals using a pair of transistors for the purpose of increasing sensitivity, for example, has been proposed (e.g., refer to Patent Literature 1). Such a differential amplification-type solid-state image sensor has unit pixels from which pixel signals are read and dummy pixels from which no signals are read arranged therein. In addition, a readout circuit included in the solid-state image sensor reads pixel signals differentially amplified by a differential pair formed by an amplifier transistor included in a unit pixel and an amplifier transistor included in a dummy pixel and performs a correlated double sampling (CDS) process thereon.

Here, the CDS process is a process of reducing fixed-pattern noise by reading signals from pixels twice and obtaining a difference between levels of the signals as pixel data. The level of signals read the first time is called a P-phase level and the level of signals read the second time is called a D-phase level.

CITATION LIST

Patent Literature

Patent Literature 1: JP 2008-271280A

DISCLOSURE OF INVENTION

Technical Problem

In the above-described technology of the related art, the readout circuit outputs data of a difference between the P-phase level and the D-phase level as pixel data having a value corresponding to an amount of exposure. With regard to the technology of the related art, however, there is concern of a black dot phenomenon occurring in a case in which very strong light is incident, in which pixel data of light approaches a value close to "0" (a black level) in spite of the incidence of the light. The reason for occurrence of the black dot phenomenon is that a very large amount of electric charges is generated in a photodiode due to strong light and the electric charges may leak into a floating diffusion layer, which causes the P-phase level to increase and thus there is substantially no difference between the P-phase level and the D-phase level.

In consideration of the above circumstances, the present technology aims to prevent the black dot phenomenon from occurring in a differential amplification-type solid-state image sensor.

Solution to Problem

The present technology has been made to solve the above problems, and a first aspect thereof is a solid-state image sensor and a control method thereof, the solid-state image sensor including: a signal-side amplifier transistor configured to generate an output voltage corresponding to a signal current corresponding to one of a pair of differential input voltages by supplying the signal current from an output node to a common-phase node; a reference-side amplifier transistor configured to supply a reference current corresponding to the other one of the pair of differential input voltages to the common-phase node; a constant current source configured to constantly control a sum of the signal current and the reference current to be merged at the common-phase node; and a bypass control unit configured to connect the output node and the common-phase node and supply the signal current having a value corresponding to a predetermined limit voltage to the common-phase node in a case in which the output voltage reaches the limit voltage. Accordingly, an effect of connecting the output node and the common-phase node is exhibited in the case in which the output voltage reaches the predetermined limit voltage.

In addition, according to the first aspect, a signal processing unit configured to perform predetermined signal processing by reading a signal from an effective pixel circuit among the effective pixel circuit and a dummy pixel circuit may be included. The signal-side amplifier transistor may be disposed in the effective pixel circuit, and the reference-side amplifier transistor may be disposed in the dummy pixel circuit. Accordingly, an effect of connecting the output node and the common-phase node is exhibited in a case in which an output voltage of the effective pixel circuit reaches a predetermined limit voltage.

In addition, according to the first aspect, the dummy pixel circuit may be shielded from light. Accordingly, an effect of connecting the output node and the common-phase node is exhibited in a case in which an output voltage of an effective pixel circuit not shielded from light reaches a predetermined limit voltage.

In addition, according to the first aspect, the dummy pixel circuit may not be shielded from light and may be disposed in proximity to the effective pixel circuit. Accordingly, an effect of connecting the output node and the common-phase node is exhibited in a case in which an output voltage of the effective pixel circuit in proximity to the dummy pixel circuit reaches a predetermined limit voltage.

In addition, according to the first aspect, the bypass control unit may include a bypass transistor having a source connected to the output node. Accordingly, an effect of connecting the output node and the common-phase node by the bypass transistor is exhibited.

In addition, according to the first aspect, the signal-side amplifier transistor may output a P-phase level as the output voltage and then output a D-phase level that is different from the P-phase level as the output voltage. The limit voltage may include a P-phase limit voltage that limits the P-phase level and a D-phase limit voltage that limits the D-phase level. Accordingly, an effect of limiting the P-phase level and the D-phase level is exhibited.

In addition, according to the first aspect, the bypass control unit may further include first and second resistive elements connected to the bypass transistor in parallel. A gate and a drain of the bypass transistor may be short-circuited. A resistance value of the first resistive element may be a value corresponding to the P-phase limit voltage, and a resistance value of the second resistive element may be a value corresponding to the D-phase limit voltage. Accordingly, an effect of limiting a P-phase level and a D-phase level using limit voltages corresponding to the resistance values of the first and second resistive elements is exhibited.

In addition, according to the first aspect, the bypass transistor may include first and second bypass transistors having different threshold voltages. Gates and drains of the first and second bypass transistors may be short-circuited. A threshold voltage of the first bypass transistor may be a value corresponding to the P-phase limit voltage, and a threshold voltage of the second bypass transistor may be a value corresponding to the D-phase limit voltage. Accordingly, an effect of limiting a P-phase level and a D-phase level using limit voltages corresponding to the threshold voltages of the first and second bypass transistors is exhibited.

In addition, according to the first aspect, the bypass control unit may further include a selector configured to select one of a power source voltage and first and second bias voltages that are different from each other and supply the selected voltage to a gate of the bypass transistor. The first bias voltage may be a value corresponding to the P-phase limit voltage, and the second bias voltage may be a value corresponding to the D-phase limit voltage. Accordingly, an effect of limiting a P-phase level and a D-phase level using limit voltages corresponding to the first and second bias voltages is exhibited.

In addition, a second aspect of the present technology is an electronic apparatus including: a signal-side amplifier transistor configured to generate an output voltage corresponding to a signal current corresponding to one of a pair of differential input voltages by supplying the signal current from an output node to a common-phase node; a reference-side amplifier transistor configured to supply a reference current corresponding to the other one of the pair of differential input voltages to the common-phase node; a constant current source configured to constantly control a sum of the signal current and the reference current to be merged at the common-phase node; a bypass control unit configured to connect the output node and the common-phase node and supply the signal current having a value corresponding to a predetermined limit voltage to the common-phase node in a case in which the output voltage reaches the limit voltage; and an image processing unit configured to perform predetermined image processing on image data generated from a signal of the output voltage. Accordingly, effects of connecting the output node and the common-phase node and performing image processing are exhibited in the case in which the output voltage reaches the predetermined limit voltage.

Advantageous Effects of Invention

According to the present technology, a differential amplification-type solid-state image sensor exhibits an excellent effect of prevention of the black dot phenomenon. Meanwhile, the effects described herein are not necessarily limited and may be effects described in the present disclosure.

MODE(S) FOR CARRYING OUT THE INVENTION

Exemplary embodiments for implementing the present technology (which will be referred to as embodiments below) will be described below. Description will be provided in the following order.
1. First embodiment (example in which output node and common-phase node are connected)
2. Second embodiment (example in which output node and common-phase node are connected by having effective pixel and dummy pixel in proximity)

<1. First Embodiment>
[Example of Configuration of Electronic Apparatus]

Figure 1:
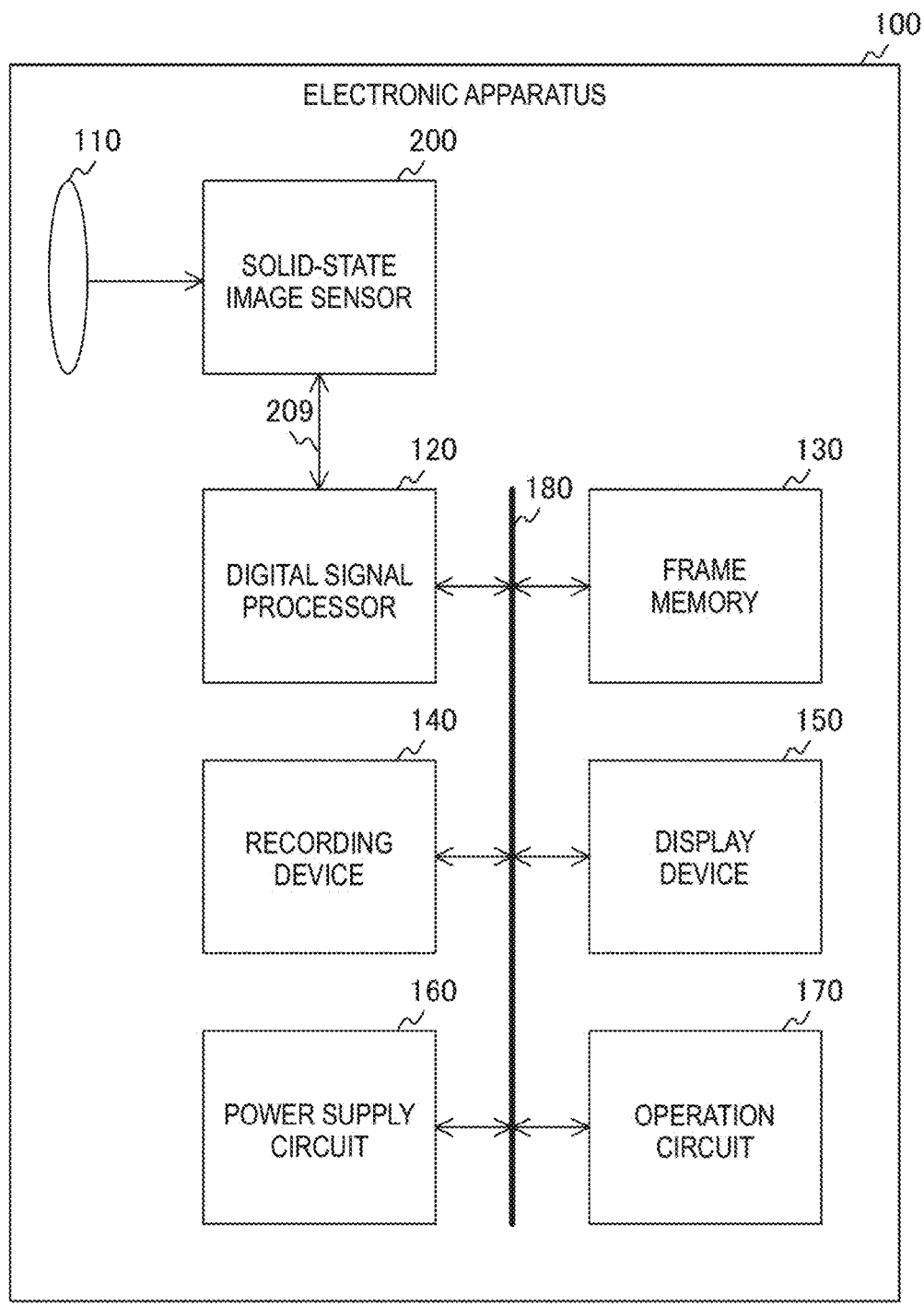
FIG. 1 is a block diagram illustrating an example of a configuration of an electronic apparatus according to a first embodiment of the present technology.

FIG. 1 is a block diagram illustrating an example of a configuration of an electronic apparatus 100 according to a first embodiment. The electronic apparatus 100 is an apparatus that produces image data and includes an imaging lens 110, a solid-state image sensor 200, a digital signal processor 120, a frame memory 130, a recording device 140, a display device 150, a power supply circuit 160, an operation circuit 170, and a bus 180. A mobile apparatus including a digital camera, a camera module, or the like can be assumed as the electronic apparatus 100.

The imaging lens 110 condenses light and guides the light to the solid-state image sensor 200. The solid-state image sensor 200 photoelectrically converts light incident from the imaging lens 110 to generate image data under control of the digital signal processor 120. This solid-state image sensor 200 supplies the image data to the digital signal processor 120 via a signal line 209.

The digital signal processor 120 performs predetermined image processing on the image data. The digital signal processor 120 controls the solid-state image sensor 200 such that the image data is generated in accordance with an operation of pressing a shutter button or the like. Then, the digital signal processor 120 performs various kinds of image processing on the image data using the frame memory 130 when necessary. The image processing includes demosaicing, white balancing, combining, and the like. The digital signal processor 120 supplies the processed image data to the recording device 140 via the bus 180 to be recorded therein. In addition, the digital signal processor 120 causes the image data to be displayed on the display device 150 in accordance with an operation of a user. Note that the digital signal processor 120 is an example of the image processing unit described in the claim.

The frame memory 130 holds image data (frames). The recording device 140 records image data. The display device 150 displays image data. The power supply circuit 160 supplies power to circuits installed in the electronic apparatus 100.

The operation circuit 170 generates an operation signal in accordance with an operation of a user and supplies the signal to the digital signal processor 120. The bus 180 is a common path for exchanging signals between the digital signal processor 120, the frame memory 130, the recording device 140, the display device 150, the power supply circuit 160, and the operation circuit 170 with one another.

[Example of Configuration of Solid-state Image Sensor]

Figure 2:
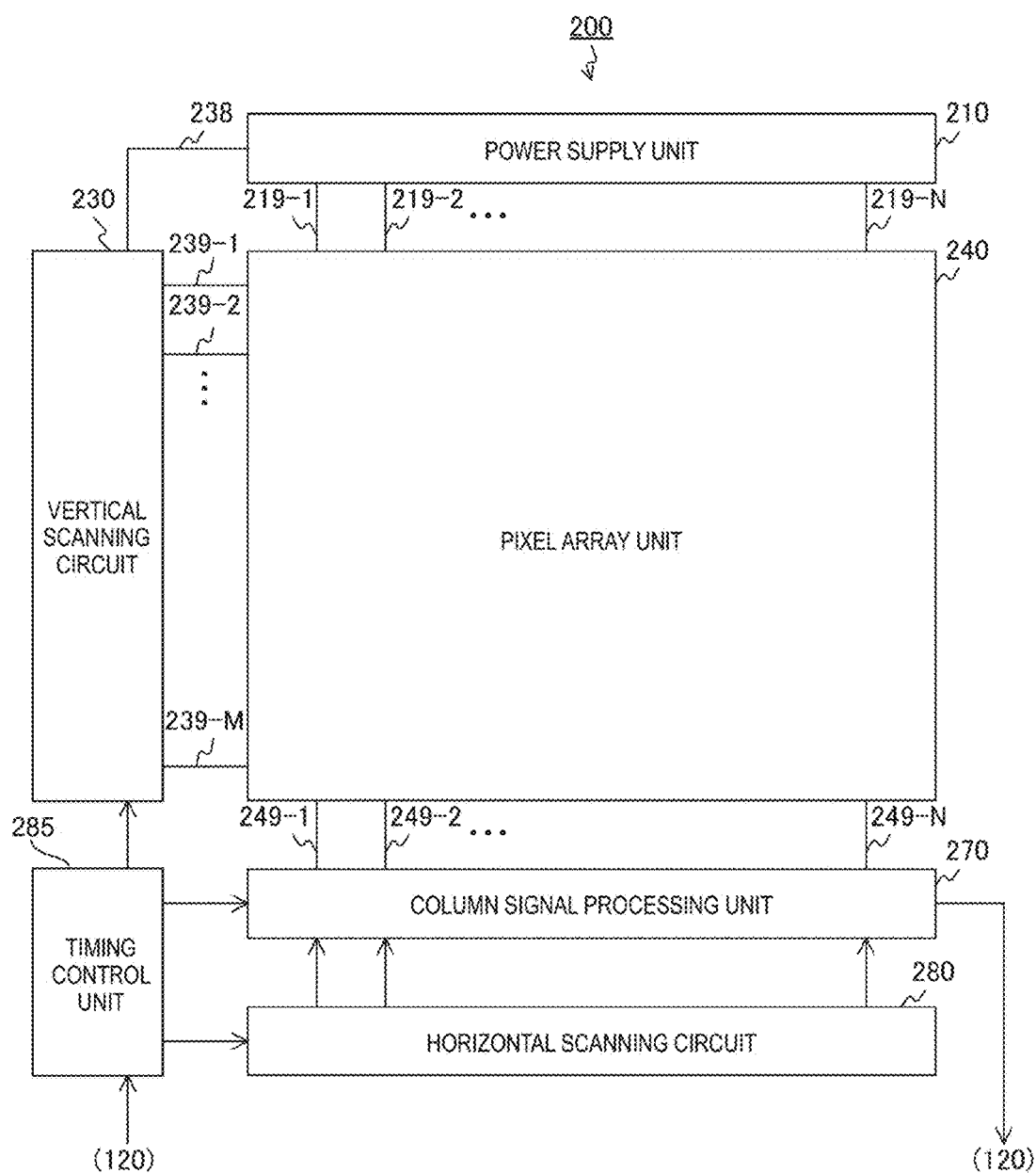
FIG. 2 is a block diagram illustrating an example of a configuration of a solid-state image sensor according to the first embodiment of the present technology.

FIG. 2 is a block diagram illustrating an example of a configuration of the solid-state image sensor 200 according to the first embodiment. The solid-state image sensor 200 includes the power supply unit 210, the vertical scanning circuit 230, the pixel array unit 240, the column signal processing unit 270, the horizontal scanning circuit 280, and the timing control unit 285.

The pixel array unit 240 has a plurality of pixel circuits arrayed in a two-dimensional grid shape. A set of pixel circuits arrayed in a predetermined direction will be referred to as a "row" below, and a set of pixel circuits arrayed in a direction perpendicular to rows will be referred to as a "column" below. In addition, the number of rows will be denoted by M (M is an integer) and the number of columns will be denoted by N (N is an integer).

The power supply unit 210 supplies power to the pixel array unit 240. The vertical scanning circuit 230 sequentially selects and drives rows under control of the timing control unit 285.

The column signal processing unit 270 performs predetermined signal processing on pixel signals from the pixel array unit 240. As the signal processing, analog-to-digital (A/D) conversion, and a CDS process are performed. The column signal processing unit 270 holds processed signals as pixel data and outputs the signals to the digital signal processor 120. Note that the column signal processing unit 270 is an example of the signal processing unit described in the claim.

The horizontal scanning circuit 280 controls the column signal processing unit 270 and sequentially outputs pixel data of the rows under control of the timing control unit 285.

The timing control unit 285 drives the vertical scanning circuit 230, the column signal processing unit 270 and the horizontal scanning circuit 280 under control of the digital signal processor 120.

Note that, although the frame memory 130 is disposed outside the solid-state image sensor 200, the frame memory may be disposed inside the solid-state image sensor 200. In addition, each of circuits installed in the solid-state image sensor 200 may be disposed on the same chip, or distributed to be disposed on a plurality of stacked chips. In this case, for example, the power supply unit 210, the vertical scanning circuit 230 and the pixel array unit 240 are disposed on one of two stacked chips and the column signal processing unit 270, the horizontal scanning circuit 280 and the timing control unit 285 are disposed on the other chip.

[Example of Configuration of Pixel Array Unit]

Figure 3:
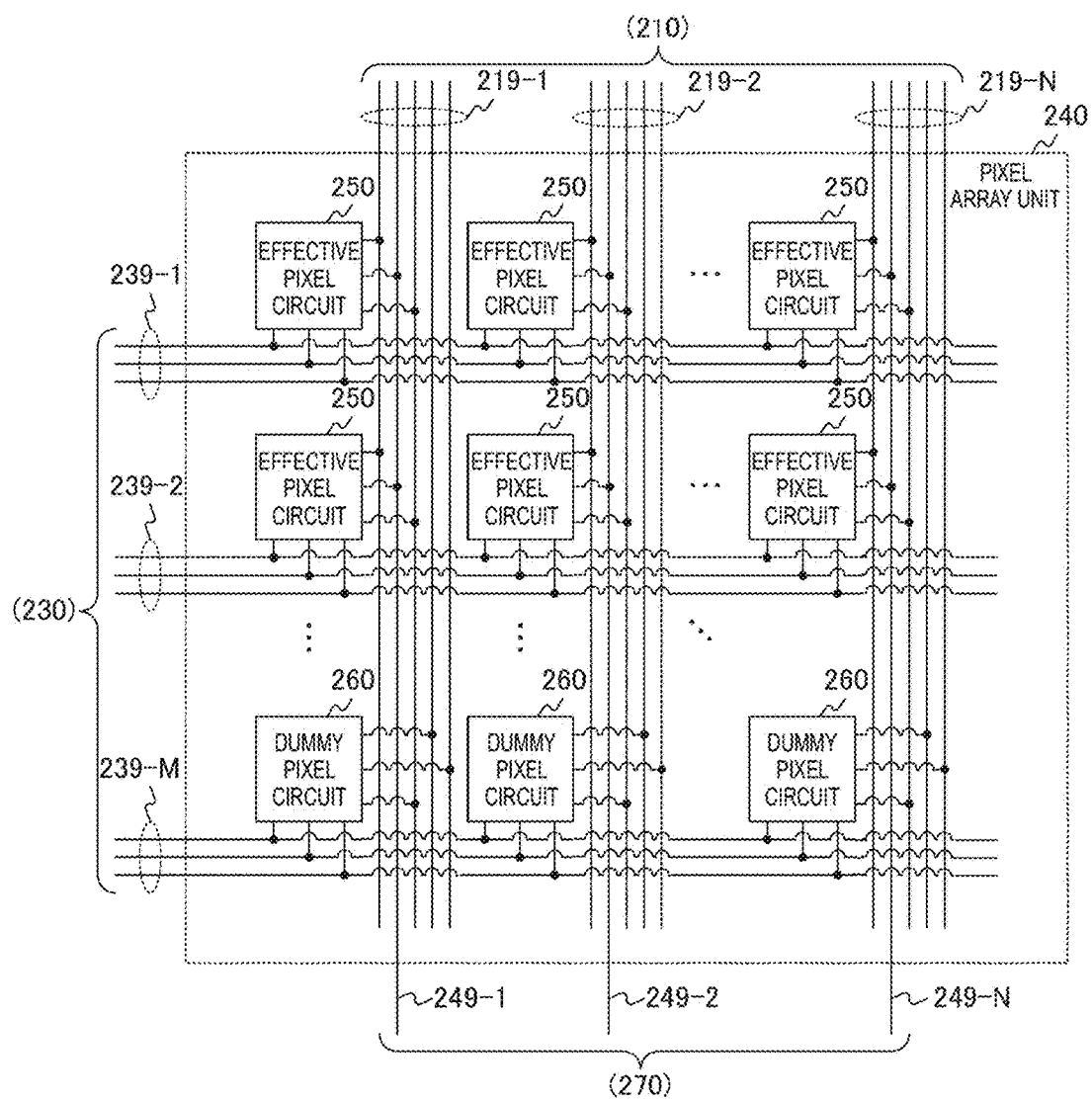
FIG. 3 is a block diagram illustrating an example of a configuration of a pixel array unit according to the first embodiment of the present technology.

FIG. 3 is a block diagram illustrating an example of a configuration of the pixel array unit 240 according to the first embodiment. The pixel array unit 240 has a plurality of pixel circuits arrayed in a two-dimensional grid shape. These pixel circuits are classified into effective pixel circuits 250 and dummy pixel circuits 260. Each of the effective pixel circuits 250 is a circuit not shielded from light and a pixel signal thereof is read by the column signal processing unit 270. On the other hand, each of the dummy pixel circuits 260 is a circuit shielded from light and no signals thereof are read by the column signal processing unit 270.

The effective pixel circuits 250 are disposed in, for example, first to M−1-th rows, and the dummy pixel circuits 260 are disposed in an M-th row. Note that a spot at which the dummy pixel circuits 260 are disposed is not limited to the M-th row. The dummy pixel circuits 260 may be disposed in, for example, the first row or an N-th column.

In addition, pixel circuits in an m-th (m is an integer from 1 to M) row are connected to a horizontal signal line group 239-$m$ including three signal lines. Pixel circuits in an n-th (n is an integer from 1 to N) column are connected to a vertical signal line group 219-$n$ including five signal lines.

[Example of Configuration of Differential Amplifier Circuit]

Figure 4:
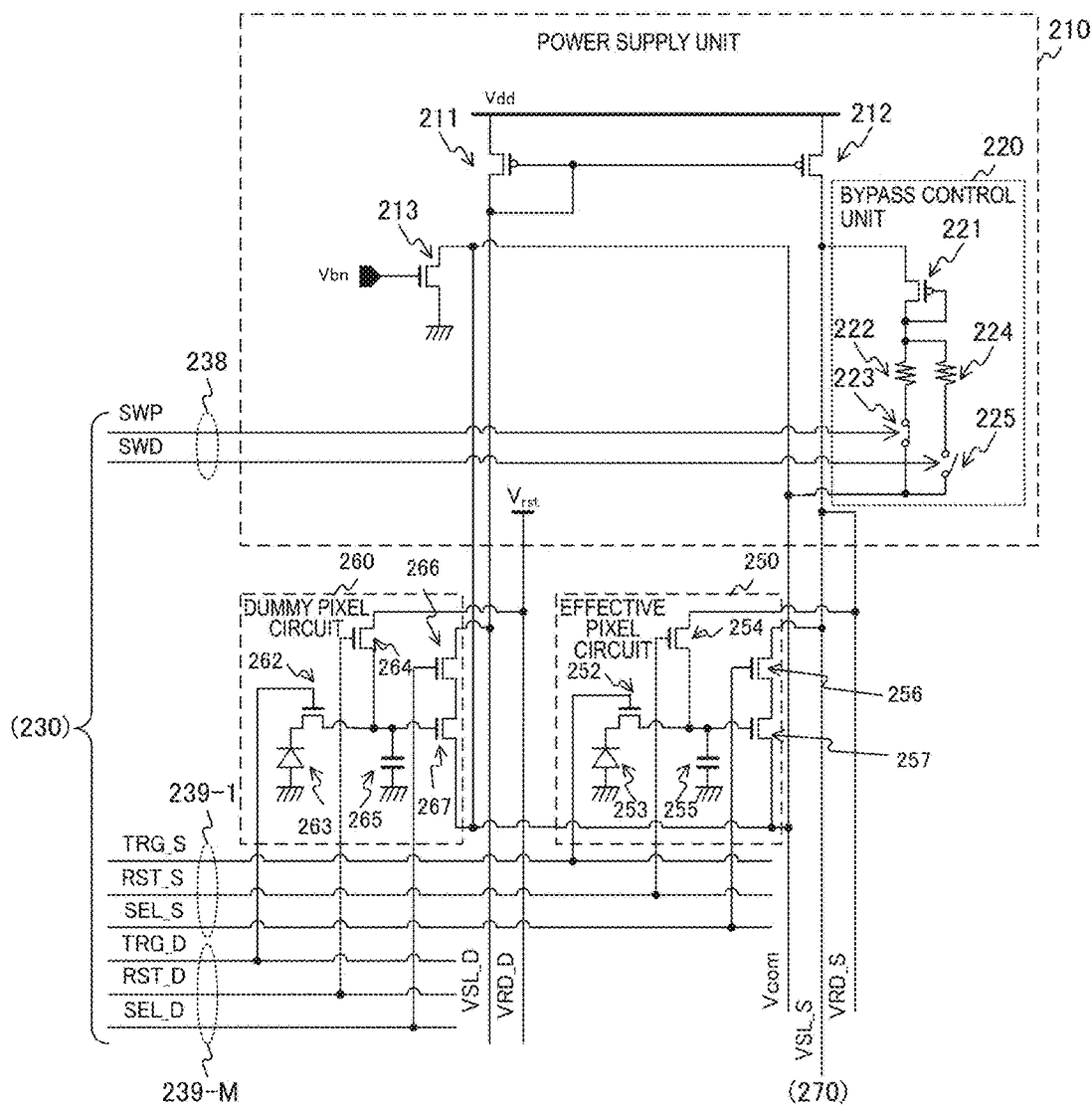
FIG. 4 is a circuit diagram illustrating an example of a configuration of a differential amplifier circuit according to the first embodiment of the present technology.

FIG. 4 is a circuit diagram illustrating an example of a configuration of a differential amplifier circuit according to the first embodiment. The power supply unit 210 includes P-type transistors 211 and 212, a constant current source 213, and a bypass control unit 220 for each column. The bypass control unit 220 includes a bypass transistor 221, resistive elements 222 and 224, and switches 223 and 225.

In addition, each effective pixel circuit 250 includes a transfer transistor 252, a photodiode 253, a reset transistor 254, a floating diffusion layer 255, a select transistor 256, and an amplifier transistor 257.

Meanwhile, each dummy pixel circuit 260 includes a transfer transistor 262, a photodiode 263, a reset transistor 264, a floating diffusion layer 265, a select transistor 266, and an amplifier transistor 267. Note that the graphic symbols indicating capacitors in FIG. 4 represent parasitic capacitances of the floating diffusion layers 255 and 265, and the capacitances are not provided as capacitive components.

The photodiode 253 photoelectrically converts light to generate electric charges (e.g., electrons). The transfer transistor 252 transfers the electric charges generated by the photodiode 253 to the floating diffusion layer 255 in accordance with a transfer signal TRG_S.

The floating diffusion layer 255 accumulates the electric charges to generate a voltage corresponding to an amount of electric charges. The reset transistor 254 sets a voltage of the floating diffusion layer 255 to be an initial value in accordance with a reset signal RST_S.

The select transistor 256 opens and closes a path between a signal line VSL_S and the amplifier transistor 257 in accordance with a select signal SEL_S. The amplifier transistor 257 amplifies a voltage of the floating diffusion layer 255. The amplifier transistor 257 supplies a current corresponding to the voltage of the floating diffusion layer 255 as a signal current. An output voltage is generated using this signal current and output from the signal line VSL_S. Note that the amplifier transistor 257 is an example of the signal-side amplifier transistor described in the claims.

In addition, a drain of the reset transistor 254 is connected to a signal line VRD_S, and a drain of the select transistor 256 is connected to the signal line VSL_S.

Configurations of constituent elements included in the dummy pixel circuit 260 are similar to those of the effective pixel circuit 250. However, a source of the amplifier transistor 267 as well as a source of the amplifier transistor 257 is connected to a signal line Vcom. In addition, a drain of the reset transistor 264 is connected to the signal line VRD_S to which a reset voltage $V_{rst}$ is applied, and a drain of the select transistor 266 is connected to a signal line VSL_D. In addition, the transfer transistor, the reset transistor, and the select transistor included in the dummy pixel circuit 260 are controlled using a transfer signal TRG_D, a reset signal RST_D, and a select signal SEL_D. Note that the amplifier transistor 267 is an example of a reference-side amplifier transistor described in the claims.

In addition, a gate of the P-type transistor 211 of the power supply unit 210 is connected to a gate of the P-type transistor 212. A source of the P-type transistor 211 is connected to the gate thereof and the signal line VSL_D, and a drain thereof is connected to a power source of a power source voltage Vdd. Meanwhile, a source of the P-type transistor 212 is connected to the signal line VSL_S, and a drain thereof is connected to the power source. With this configuration, the P-type transistor 211 outputs a reference current from the source thereof, and the P-type transistor 212 outputs a signal current having a value close to the reference current from the source thereof. The above-described circuit is also called a current mirror circuit.

The vertical signal line group 219-$n$ including the signal lines VRD_S, VSL_S, Vcom, VRD_D and VSL_D is provided in each column.

The constant current source 213 performs control to maintain currents from the signal line Vcom to be constant. The constant current source 213 is realized by, for example, an N-type transistor to a gate of which a predetermined bias voltage Vbn is applied.

A differential amplifier circuit that amplifies a pair of differential input voltages is configured by the above-described current mirror circuit, the amplifier transistors 267 and 257, and the constant current source 213. One of the pair of differential input voltages is input to the amplifier transistor 257 and the other thereof is input to the amplifier transistor 267. Then, output voltages obtained by amplifying the differential input voltages are output to the column signal processing unit 270 via the signal line VSL_S on the drain side of the amplifier transistor 257.

Such a differential amplifier circuit generally has a higher amplification rate than a source follower circuit that does not perform differential amplification. For example, a conversion rate of pixels of a source follower circuit is assumed to be 100 µV/e$^-$, output noise of an amplifier transistor thereof is assumed to be 100 µVrms (root mean square), and noise occurring in A/D conversion is assumed to be 100 µVrms. In this configuration, total noise is 141 µVrms, and input conversion noise is 1.02 e$^-$rms. Meanwhile, a conversion rate of the pixels of the differential amplifier circuit is assumed to be 500 µV/e$^-$, output noise of the amplifier transistors is assumed to be 500 µVrms, and noise occurring in A/D conversion is assumed to be 500 µVrms. In this configuration, total noise is 510 µVrms, and input-converted noise is 1.02 e$^-$rms.

In addition, the bypass transistor 221 of the bypass control unit 220 is, for example, a P-type MOS transistor, and a gate and a drain thereof are short-circuited (i.e., in diode connection). In addition, a source of the bypass transistor 221 is connected to the signal line VSL_S. Note that the bypass transistor 221 may be an N-type transistor.

One end of each of the resistive elements 222 and 224 is connected to the drain of the bypass transistor 221. In addition, the other end of the resistive elements 222 is connected to a switch 223, and the other end of the resistive element 224 is connected to the switch 225. Furthermore, resistance values of the resistive elements 222 and 224 are different from each other. Note that the resistive elements 222 and 224 are examples of the first and second resistive elements described in the claim.

The switch 223 opens and closes a path between the resistive element 222 and the signal line Vcom in accordance with a switching signal SWP. The switch 225 opens and closes a path between the resistive element 224 and the signal line Vcom in accordance with a switching signal SWD.

The vertical scanning circuit 230 selects any row of the effective pixel circuits 250 and the row of the dummy pixel circuits 260 at the same time to drive the circuits using the reset signals, the transfer signals, and the select signals. A pair of an effective pixel circuit 250 in the selected row and the dummy pixel circuit 260 in the same column as that of the effective pixel circuit operates as a differential amplifier circuit to generate a pixel signal. A function of the bypass control unit 220 will be described below in detail.

[Example of Configuration of Column Signal Processing Unit]

Figure 5:
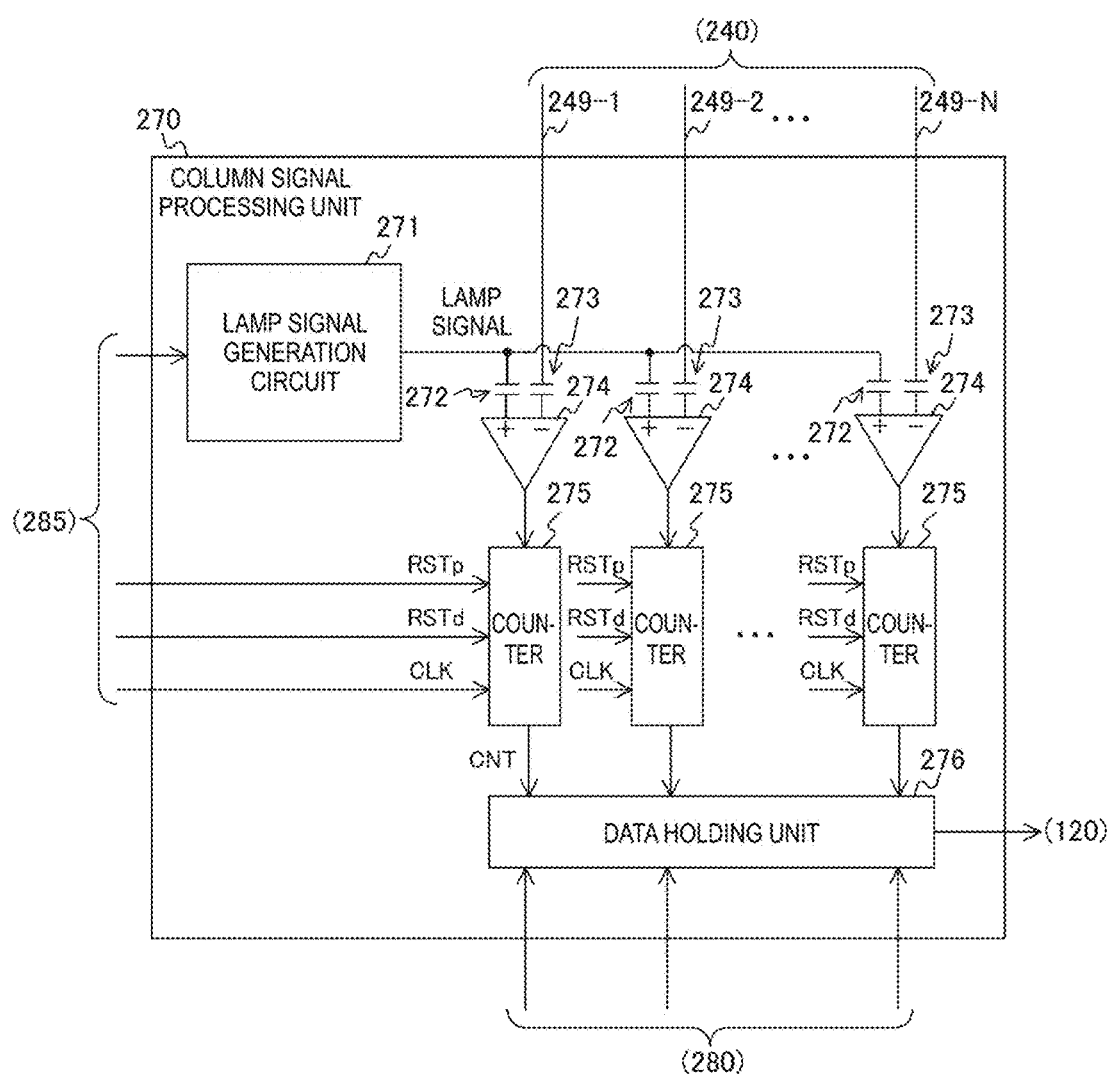
FIG. 5 is a block diagram illustrating an example of a configuration of a column signal processing unit according to the first embodiment of the present technology.

FIG. 5 is a block diagram illustrating an example of a configuration of the column signal processing unit 270 according to the first embodiment. The column signal processing unit 270 includes a lamp signal generation circuit 271, N capacitors 272, N capacitors 273, N comparators 274, N counters 275, and a data holding unit 276. Each of the capacitors 272, the capacitors 273, the comparators 274, and the counters 275 is provided in each column.

The lamp signal generation circuit 271 generates a lamp signal having a level increasing at a constant speed in accordance with control of the timing control unit 285.

The capacitors 272 hold lamp signals. The capacitors 273 hold pixel signals coming from corresponding columns. These capacitors realize an autozero function.

The comparators 274 compares lamp signals and pixel signals of corresponding columns. These comparators 274 supply the comparison results to the counters 275 of the corresponding columns.

The counters 275 count values on the basis of the comparison results of the comparators 274. Each of the counters 275 receives a clock signal CLK, and reset signals RSTp and RSTd as an input from the timing control unit 285. When the reset signal RSTp is input, the counters 275 set count values to an initial value. Then, the counters 275 increment the count values in synchronization with the clock signal CLK until a level of the lamp signal exceeds a level of a pixel signal. Accordingly, a P-phase level is measured.

In addition, when the reset signal RSTd is input, the counters 275 reverse the sign of the count values. Then, the counters 275 increment the count values in synchronization with the clock signal CLK until the level of the lamp signal exceeds the level of the pixel signal. Accordingly, a difference between the P-phase level and a D-phase level is measured. The counters 275 output data of the difference to the data holding unit 276 as pixel data. The process of obtaining the difference between the P-phase level and the D-phase level is called a CDS process. The capacitors 272 and 273 execute an analog CDS process, and the counters 275 execute a digital CDS process.

The data holding unit 276 holds N pieces of pixel data. The data holding unit 276 sequentially outputs the held pieces of the pixel data in accordance with control of the horizontal scanning circuit 280.

Figure 6:
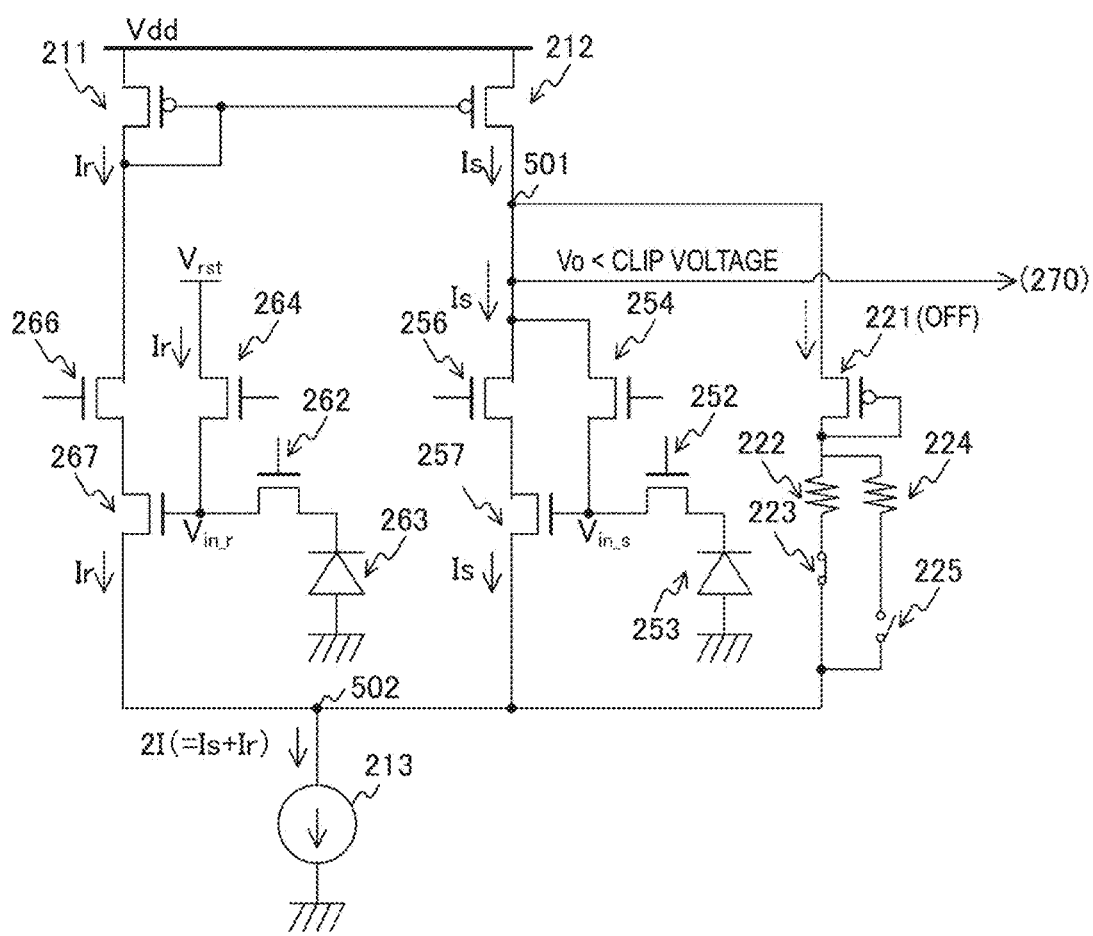
FIG. 6 is a diagram illustrating an example of currents flowing in the differential amplifier circuit before limitation according to the first embodiment of the present technology.

FIG. 6 is a diagram illustrating an example of currents flowing in the differential amplifier circuit before limitation according to the first embodiment. When the P-phase level is to be measured, the vertical scanning circuit 230 performs control such that the switch 223 is in a closed state using the switching signal SWP and that the switch 225 is in an open state using the switching signal SWD.

Here, a voltage of a node on the source side of the P-type transistor 212 is output to the column signal processing unit 270 as an output voltage Vo of the differential amplifier circuit. This node will be referred to as an output node 501 below. In addition, a node of the constant current source 213 on the amplifier transistor side has a common-phase voltage. This node will be referred to as a common-phase node 502 below. The gate of the amplifier transistor 267 receives $V_{in\_r}$ that is one of differential input voltages as an input, and the gate of the amplifier transistor 257 receives $V_{in\_s}$ that is the other one of the differential input voltages as an input. The input voltage $V_{in\_r}$ is a voltage of the floating diffusion layer of the dummy pixel circuit 260, and the input voltage $V_{in\_s}$ is a voltage of the floating diffusion layer of the effective pixel circuit 250.

The vertical scanning circuit 230 controls the select transistor 256 of a selected row and the select transistor 266 included in the dummy pixel 260 such that the transistors are in an on-state. Then, the vertical scanning circuit 230 sets the reset transistors 264 and 254 to be in an on-state to initialize the input voltages $V_{in\_r}$ and $V_{in\_s}$.

The P-type transistor 211 of the current mirror circuit supplies a reference current Ir, and the P-type transistor 212 supplies a signal current Is having a value close to the reference current Ir. These currents are expressed by, for example, the following formulas.

$$Ir = I + \Delta I \qquad \text{Formula 1}$$

$$Is = I - \Delta I \qquad \text{Formula 1}$$

The reference current Ir and the signal current Is are merged at the common-phase node 502, and the sum thereof is controlled by the constant current source 213 to be constant. A current $I_{const}$ caused to flow from the common-phase node 502 to a grounded node by the constant current source 213 is expressed using the following formula.

$$I_{const} = Is + Ir \qquad \text{Formula 3}$$

$I_{const}$ of Formula 3 is 2I on the basis of Formulas 1 and 2. The reference current Ir and the signal current Is are equal immediately after the input voltages $V_{in\_r}$ and $V_{In\_s}$ are initialized. For example, if $I_{const}$ is set to be 20 microampere (µA), both the reference current Ir and the signal current Is are 10 microampere (µA).

Then, since the effective pixel circuit 250 is not shielded from light while the dummy pixel circuit 260 is shielded from light, the photodiode 253 included in the effective pixel circuit 250 generates electric charges.

The vertical scanning circuit 230 causes the transfer transistor 252 included in the effective pixel circuit 250 to be an off-state at the time of readout of the P-phase level. Thus, electric charges of the photodiode 253 are not transferred to the floating diffusion layer and the input voltage $V_{in\_s}$ still has the initial value normally.

However, when a very large amount of light is incident, like when imaging is performed under the sun, the photodiode 253 may generate a large amount of electric charges, and the electric charges leak into the floating diffusion layer exceeding a potential of the transfer transistor 252. As a result, there is concern of the output voltage Vo (having the P-phase level) increasing.

In a case in which the output voltage Vo is lower than a limit voltage $V_{clip\_p}$ expressed by the following formula, a gate-source voltage of the bypass transistor 221 is lower than a threshold voltage, and thus the bypass transistor 221 is in an off-state.

$$V_{clip\_p} = Vc + Rp \times Is' + |V_{th}|$$

Vc of the above formula represents a common voltage of the common-phase node 502, and a unit thereof is, for example, volt (V). Rp represents a resistance value of the resistive element 222, and a unit thereof is, for example, ohm (Ω). Is' represents a signal current corresponding to $V_{clip\_p}$, and a unit thereof is, for example, ampere (A). $V_{th}$ represents a threshold voltage of the bypass transistor 221, and a unit thereof is, for example, volt (V).

In a case in which the bypass transistor 221 is in an off-state (the P-phase level is lower than the limit voltage $V_{clip\_p}$), no current flows in the bypass control unit 220, and the signal current Is flows from the output node 501 to the common-phase node 502 via the amplifier transistor 257.

Figure 7:
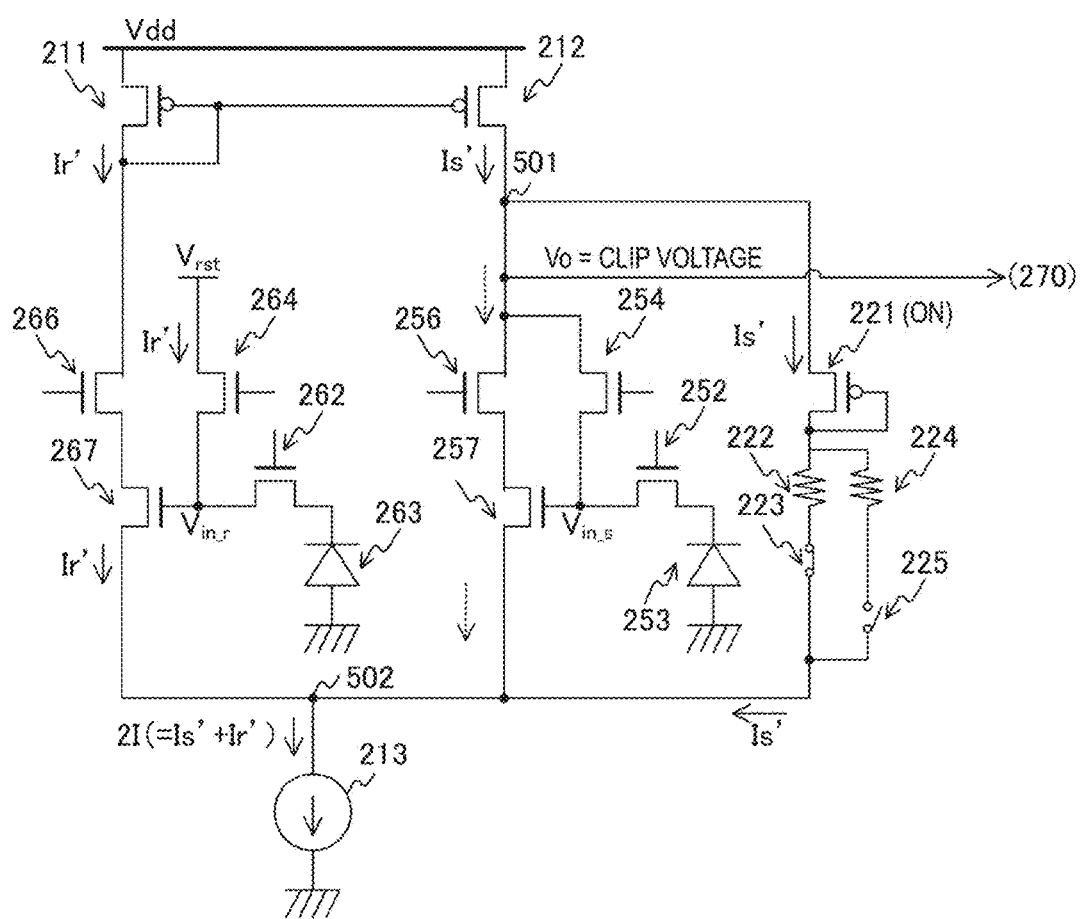
FIG. 7 is a diagram illustrating an example of currents flowing in the differential amplifier circuit after limitation according to the first embodiment of the present technology.

FIG. 7 is a diagram illustrating an example of currents flowing in the differential amplifier circuit after limitation according to the first embodiment. When the output voltage Vo reaches the limit voltage $V_{clip\_p}$, the gate-source voltage of the bypass transistor 221 exceeds the threshold voltage and the bypass transistor 221 transitions to an on-state. Accordingly, the output node 501 and the common-phase node 502 are connected via the bypass transistor 221 (bypass), and a signal current Is' flows in the bypass control unit 220. At this time, the P-type transistor 211 supplies Ir' (=2I−Is').

Since a current flowing in the constant current source 213 (=Is'+Ir') is constant, no current flows in the amplifier transistor 257. Thus, an increase of the output voltage Vo stops and is fixed to the limit voltage $V_{clip\_p}$ (in other words, clipped).

Then, the vertical scanning circuit 230 causes the switch 223 to be in an open state and the switch 225 to be in a closed state when the D-phase level is read next to the P-phase level. Accordingly, the D-phase level is fixed to a limit voltage $V_{clip\_d}$ expressed by the following formula. Note that it is desirable that the limit voltages $V_{clip\_p}$ and $V_{clip\_d}$ are equal to or lower than an upper limit voltage at which the amplifier transistors operate in a saturation region.

$$V_{clip\_d}=Vc+Rd\times Is'+|V_{th}|$$

Rd in the above formula represents a resistance value of the resistive element 224, and a unit thereof is, for example, ohm (Ω). Since Rp and Rd are different values as described above, the D-phase level is clipped at a value different from that of the P-phase level.

Here, a configuration without the bypass control unit 220 is assumed as a comparative example. Also in this comparative example, the photodiode 253 generates a large amount of electric charges when very strong light is incident, and the electric charges may leak into the floating diffusion layer, exceeding a potential of the transfer transistor 252. As a result, the output voltage Vo (the P-phase level) increases.

However, since the P-phase level is not limited in the comparative example in which the bypass control unit 220 is not provided, the P-phase level can increases up to a value close to the power source voltage Vdd. Although the D-phase level is generated next to the P-phase level, a D-phase level having a value close to the power source voltage Vdd is likewise generated in an environment of high luminance. If the P-phase level and the D-phase level are equal as described above, a difference thereof approaches "0" in the CDS process, pixel data of a black level is output in spite of strong incident light. In other words, black dot phenomenon occurs.

On the other hand, in solid-state image sensor 200, since the bypass control unit 220 causes the output node and the common-phase node to take the bypass to limit the P-phase level to the limit voltage $V_{clip\_p}$ or lower, the P-phase level and the D-phase level do not have the same value even if strong light is incident. Accordingly, the black dot phenomenon can be solved.

In addition, if the limit voltages $V_{clip\_p}$ and $V_{clip\_d}$ are not set to be an upper limit voltage or lower at which the amplifier transistors operate in a saturation region, there is concern of amplitude of the output voltage Vo significantly increasing when strong light is incident. If amplitude of the output voltage Vo is large, the amplifier transistor 257 may operate in a range of a region other than the saturation region (a linear region or a cutoff region). In this case, a setting time in which the amplifier transistor 257 returns to the saturation region before the next readout starts is necessary. A frame rate is lowered in accordance with a setting time when a plurality of pieces of image data are obtained.

However, in solid-state image sensor 200, the amplitude of the output voltage Vo can be suppressed and the amplifier transistor 257 can be caused to operate in the saturation region since the phase levels are limited to the upper limit voltage of the saturation region or lower. Thus, a setting time is unnecessary and the frame rate can be improved accordingly.

Note that, although the solid-state image sensor 200 limits both the D-phase level and the P-phase level, a configuration in which the P-phase level is not limited may be employed in a case in which the P-phase level is limited using an overflow gate or the like. In the case in which the P-phase level is not limited, the resistive elements 224 and the switch 225 on the P-phase side are unnecessary.

[Example of Operation of Pixel Circuit]

Figure 8:
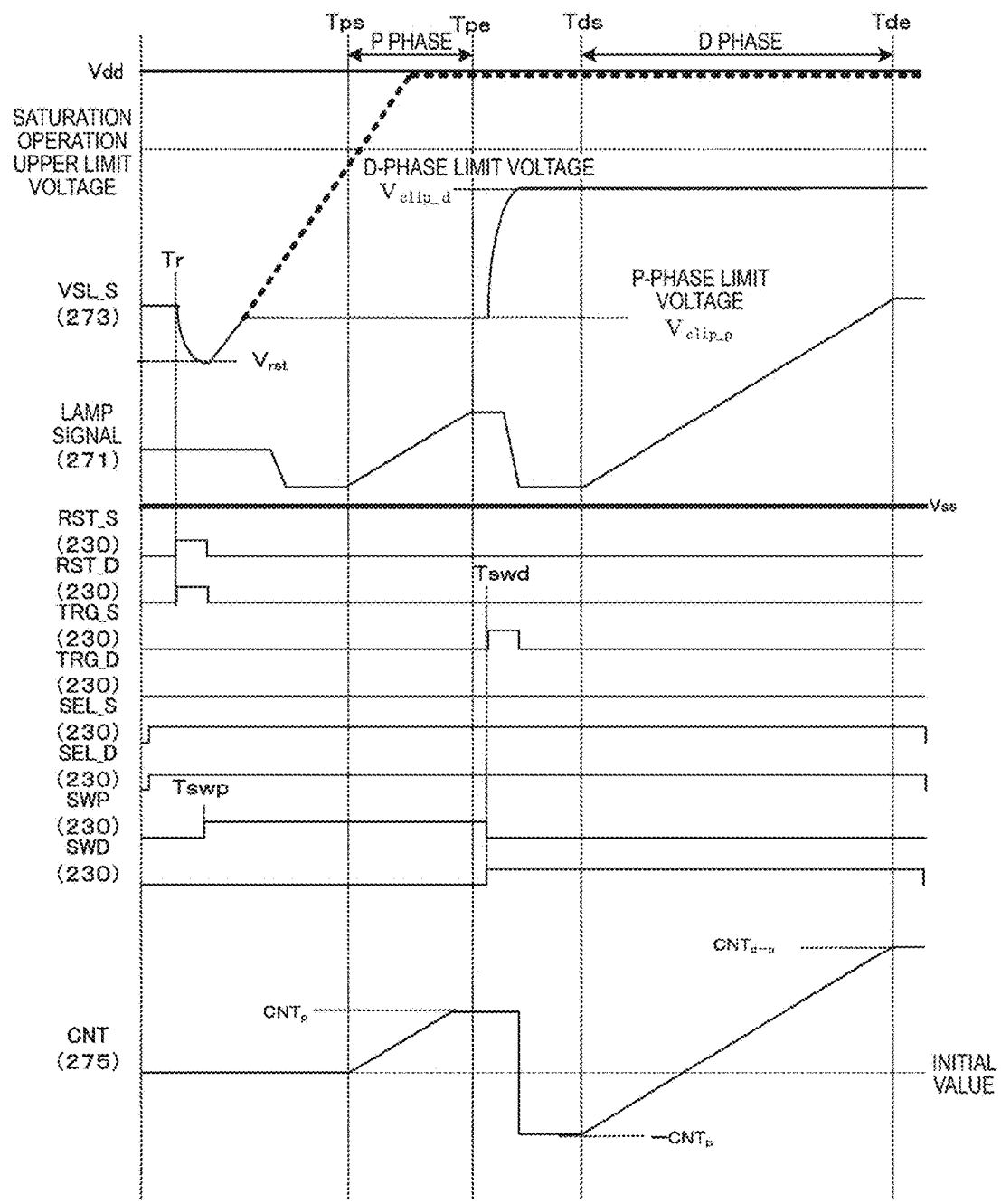
FIG. 8 is a timing chart showing an example of a driving operation of a pixel circuit according to the first embodiment of the present technology.

FIG. 8 is a timing chart showing an example of a driving operation of a pixel circuit according to the first embodiment of the present technology. The timing control unit 285 resets a count value CNT of each of the counters 275 before exposure. In addition, the vertical scanning circuit 230 sets the select signal SEL_S and the select signal SEL_D of selected rows to be a high level, and sets the reset signals RST_S and RST_D of the rows to be a high level through a predetermined pulse period from a start timing Tr of exposure of the rows.

At the time of reset, the floating diffusion layer is initialized due to a voltage follower function of the differential amplifier circuit, the output voltage Vo of the signal line VSL_S of the differential amplifier circuit has a value close to the reset voltage $V_{rst}$ (a low level). Although voltages of the floating diffusion layers 265 and 255 are lowered due to switch feedthrough when the signal lines RST_S and RST_D are at a low level, a change in voltages of the signal lines RST_S and RST_D is suppressed due to a common-phase cancellation effect of the differential amplifier circuit.

In addition, at a timing Tswp immediately after the timing Tr, the vertical scanning circuit 230 performs control such that the switch 223 on the P-phase side is in a closed state by setting the switching signal SWP to a high level. Accordingly, the P-phase level is limited to the limit voltage $V_{clip\_p}$ or lower.

Then, a lamp signal increases through a period from a timing Tps to Tpe after the timing Tr, and the counters 275 counts the count value $CNT_p$ of the P-phase level. That is, the column signal processing unit 270 reads the P-phase level. In the case in which very strong light is incident, electric charges leak from the photodiode to the floating diffusion layer, the output voltage Vo (the P-phase level) of the signal line VSL_S may continuously increase even after a reset. Since the P-phase level is not limited in the comparative example in which no bypass control unit 220 is provided, the P-phase level may reach a value close to the power source voltage Vdd. The thick dotted line in FIG. 8 represents an example a change in the output voltage Vo in the comparative example. If the bypass control unit 220 is provided, the P-phase level is limited as indicated by the solid line in the drawing.

In addition, at a timing Tswd that comes after an exposure time elapses from the reset of the floating diffusion layer, the vertical scanning circuit 230 sets the transfer signal TRG_S to be a high level through the pulse period. Accordingly, electric charges are transferred to the floating diffusion layer, and an output of the D-phase level starts. Furthermore, the vertical scanning circuit 230 sets the switching signal SWP to be a low level and the switching signal SWD to be a high level, and thereby controls the switch 225 on the D-phase side so as to be in a closed state. Accordingly, the D-phase level is limited to the limit voltage $V_{clip\_d}$ or lower. In addition, the timing control unit 285 reverses the sign of the count value of the counter 275 to be $-CNT_p$.

Here, a potential difference between the limit voltage $V_{clip\_p}$ and the limit voltage $V_{clip\_d}$ is set such that, for example, a count value $CNT_{d-p}$ corresponding to the potential difference thereof exceeds full code of pixel data. For example, in a case in which the number of quantization bits of A/D conversion is 12 and count values "0" to "4095" are counted, the potential difference is set to exceed a level corresponding to "4095." In this setting, the solid-state image sensor 200 can output pixel data with full code (white) when strong light is incident.

The lamp signal increases through the period from a timing Tds after the timing Tswd to a timing Tde, and the counter 275 counts the count value $CNT_{d-p}$ corresponding to the difference between the P-phase level and the D-phase level. Data of this difference is read as pixel data.

The D-phase level is not limited as well in the comparative example in which no bypass control unit 220 is provided, and thus the D-phase level also increases to a value closed to the power source voltage Vdd. Then, the difference between the P-phase level and the D-phase level becomes substantially "0," pixel data having a level close to a black level is output. In other words, the black dot phenomenon occurs.

On the other hand, since the bypass control unit 220 limits the P-phase level in the solid-state image sensor 200, the black dot phenomenon can be suppressed. In addition, since the P-phase level and the D-phase level are limited to be the upper limit voltage or lower of the saturation operation region, amplitude of the output voltage Vo can be suppressed, and the amplifier transistor 257 can be set to operate in the saturation region. Accordingly, a setting time is unnecessary, and a frame rate can be improved accordingly.

Figure 9:
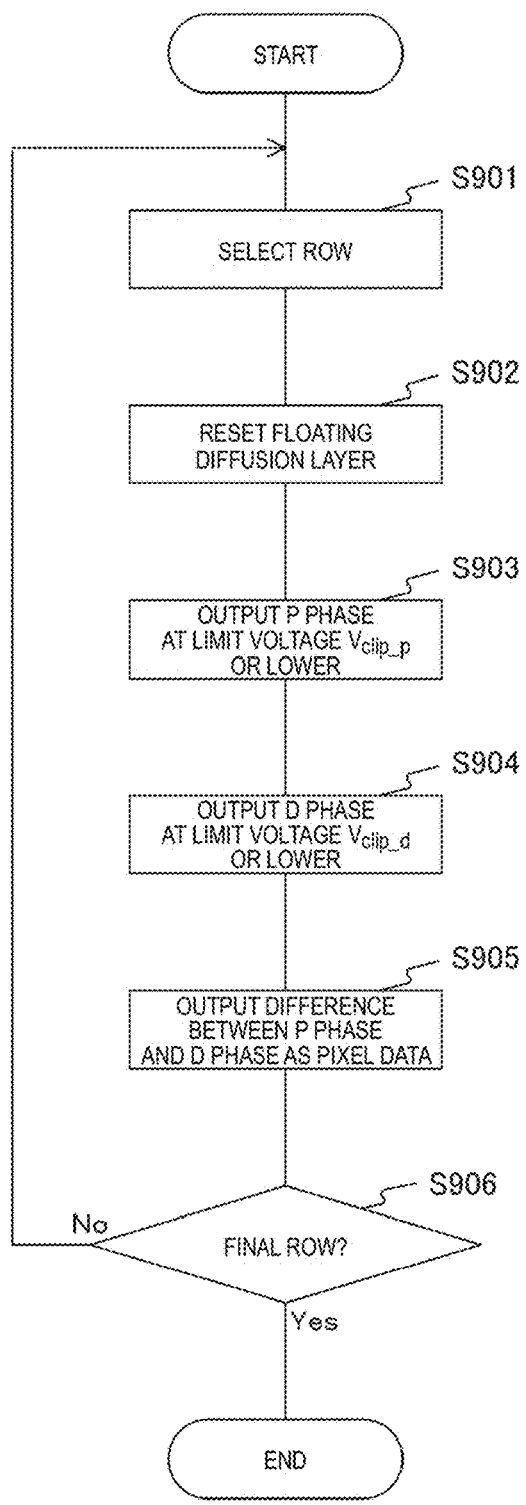
FIG. 9 is a flowchart showing an example of an operation of the solid-state image sensor according to the first embodiment of the present technology.

FIG. 9 is a flowchart showing an example of an operation of the solid-state image sensor 200 according to the first embodiment. This operation starts when, for example, an operation for producing image data (pressing a shutter button, or the like) is performed.

The vertical scanning circuit 230 selects a row that has not been selected (Step S901), resets a voltage of the floating diffusion layer of the row (Step S902). In addition, the differential amplifier circuit outputs the P-phase level limited to the limit voltage $V_{clip\_p}$ or lower (Step S903), and then outputs the D-phase level limited to the limit voltage $V_{clip\_d}$ or lower after an exposure time elapses (Step S904). The column signal processing unit 270 outputs the difference between the P-phase level and the D-phase level as pixel data (Step S905).

The vertical scanning circuit 230 determines whether a selected row is the final row (Step S906). In a case in which the row is not the final row (No in Step S906), the vertical scanning circuit 230 repeatedly executes the processes from Step S901. On the other hand, in a case in which the row is the final row (Yes in Step S906), the vertical scanning circuit 230 ends an imaging process. Note that, when a plurality of pieces of image data are produced, the processes of Steps S901 to S906 are repeatedly executed until imaging ends.

As described above, according to the first embodiment of the present technology, the bypass control unit 220 connects the output node and the common-phase node to flow a signal current therein when the P-phase level reaches the limit voltage, the P-phase level can be limited to the limit voltage or lower even when strong light is incident. Accordingly, the black dot phenomenon caused by the P-phase level and the D-phase level having close values and pixel data of a difference thereof being "0" (a black level) can be prevented.

[First Modified Example]

In the above-described first embodiment, the bypass control unit 220 limits the output voltage Vo to two different limit voltages using the two resistive elements (222 and 224). However, an output voltage can be limited to two limit voltages with no resistive elements provided. A bypass control unit 220 of a first modified example of the first embodiment is different from that of the first embodiment in that limitation using two limit voltages is realized by the bypass control unit 220 having no resistive elements.

Figure 10:
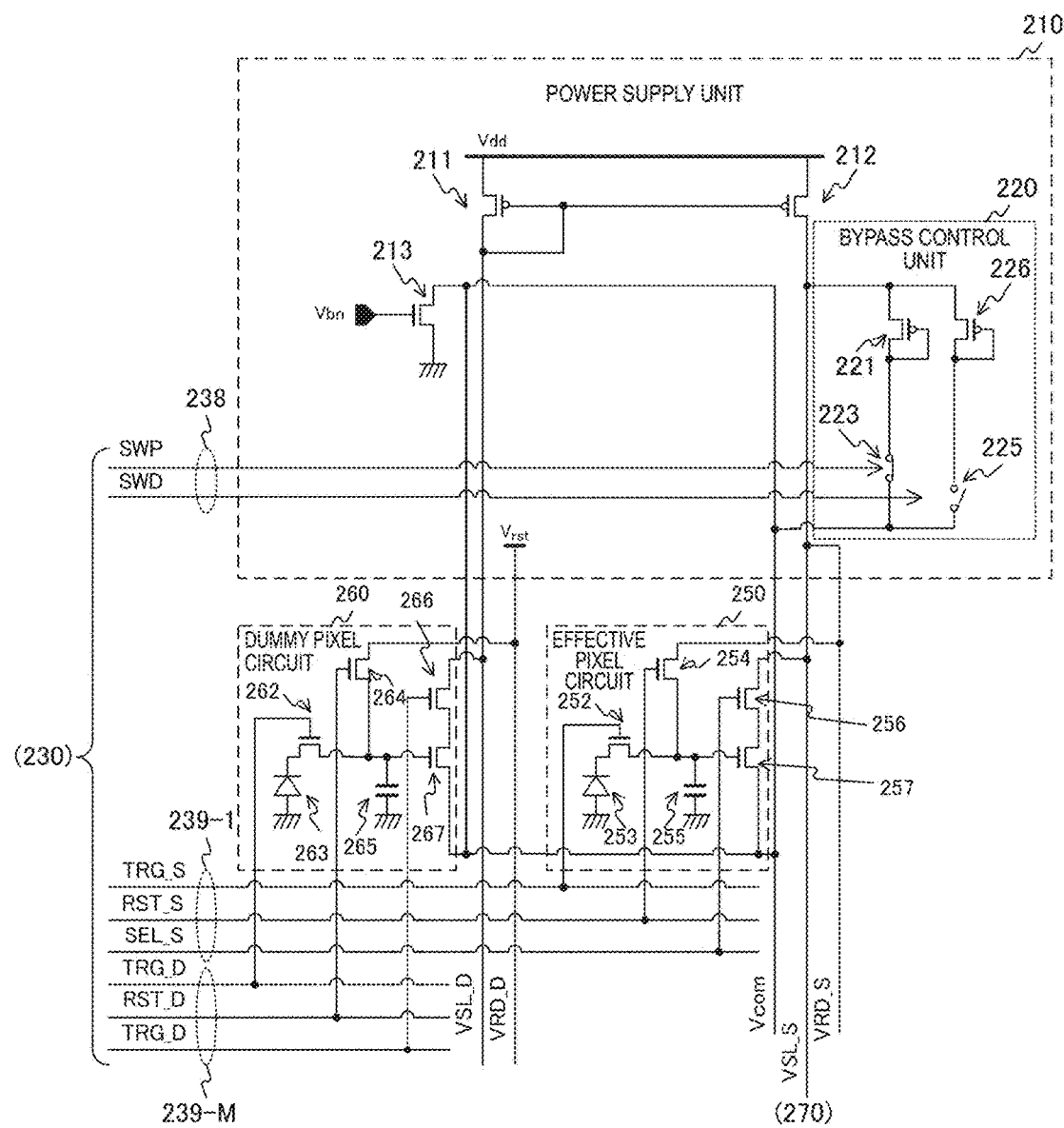
FIG. 10 is a circuit diagram illustrating an example of a configuration of a differential amplifier circuit according to a first modified example of the first embodiment of the present technology.

FIG. 10 is a circuit diagram illustrating an example of a configuration of the differential amplifier circuit according to the first modified example of the first embodiment. The bypass control unit 220 of the first modified example is different from that of the first embodiment in that a bypass transistor 226 is included instead of the resistive element 222 and 224.

The bypass transistor 226 is, for example, a P-type MOS transistor, a gate and a drain thereof are short-circuited, and a source thereof is connected to a signal line VSL_S. In addition, a threshold voltage of the bypass transistor 226 is different from that of a bypass transistor 221. Note that the bypass transistors 221 and 226 are examples of the first and second bypass transistors described in the claim. Furthermore, the bypass transistor 226 may be an N-type transistor.

In addition, a switch 223 is connected to a drain of the bypass transistor 221, and a switch 225 is connected to the drain of the bypass transistor 226.

Furthermore, if the threshold voltages of the bypass transistors 221 and 226 are set to $V_{thp}$ and $V_{thd}$ respectively, limit voltages $V_{clip\_p}$ and $V_{clip\_d}$ are expressed using the following formulas.

$$V_{clip\_p} = Vc + |V_{thp}|$$

$$V_{clip\_d} = Vc + |V_{thd}|$$

As described above, according to the first modified example of the first embodiment of the present technology, the bypass transistors 221 and 226 having different threshold voltages limit the threshold voltages, and thus limitation of the two limit voltages can be realized with no resistive elements provided.

[Second Modified Example]

In the above-described first embodiment, the bypass control unit 220 limits the output voltage Vo to the two different limit voltages using the two resistive elements (222 and 224). However, an output voltage can be limited to two limit voltages with no resistive elements provided. A bypass control unit 220 according to a second modified example of the first embodiment is different from that of the first embodiment in that limitation using two limit voltages can be realized by the bypass control unit 220 with no resistive elements provided.

Figure 11:
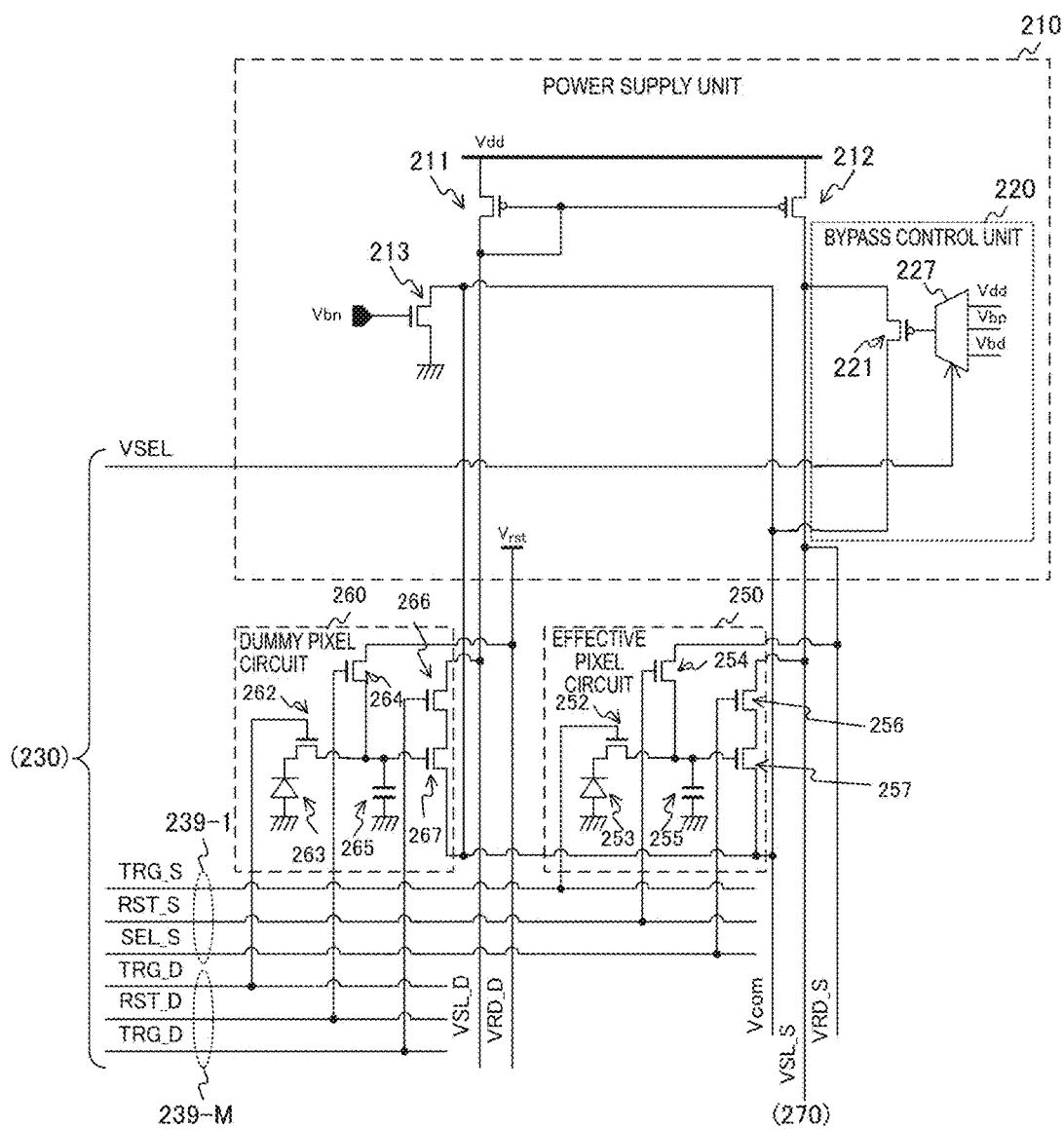
FIG. 11 is a circuit diagram illustrating an example of a configuration of a differential amplifier circuit according to a second modified example of the first embodiment of the present technology.

FIG. 11 is a circuit diagram illustrating an example of a configuration of the differential amplifier circuit according to the second modified example of the first embodiment. The bypass control unit 220 according to the second modified example is different from that of the first embodiment in that a selector 227 is included instead of the switch 223, the switch 225, and the resistive elements 222 and 224.

The selector 227 selects one of a power source voltage Vdd, a bias voltage Vbp, and another bias voltage Vbd in accordance with a select signal VSEL and outputs the one to a gate of a bypass transistor 221. The bias voltage Vbp and the bias voltage Vbd have different voltage values. In addition, the values of the bias voltage Vbp and the bias voltage Vbd are set to ones between the power source voltage Vdd and a common voltage Vc. It is desirable to set these bias voltages to be higher than the common voltage Vc. By setting the bias voltages to be higher than the common voltage Vc, the amplifier transistor 257 can operate in a saturation operation region.

The vertical scanning circuit 230 causes the bias voltage Vbp to be output in a readout period of the P-phase level using a select signal VSEL, and causes the bias voltage Vbd to be output in a readout period of the D-phase level. In addition, the vertical scanning circuit 230 causes the power source voltage Vdd to be output in period other than those periods.

Further, limit voltages $V_{clip\_p}$ and $V_{clip\_d}$ are expressed using the following formulas.

$$V_{clip\_p} = Vc + Vbp - |V_{th}|$$

$$V_{clip\_d} = Vc + Vbd - |V_{th}|$$

Figure 12:
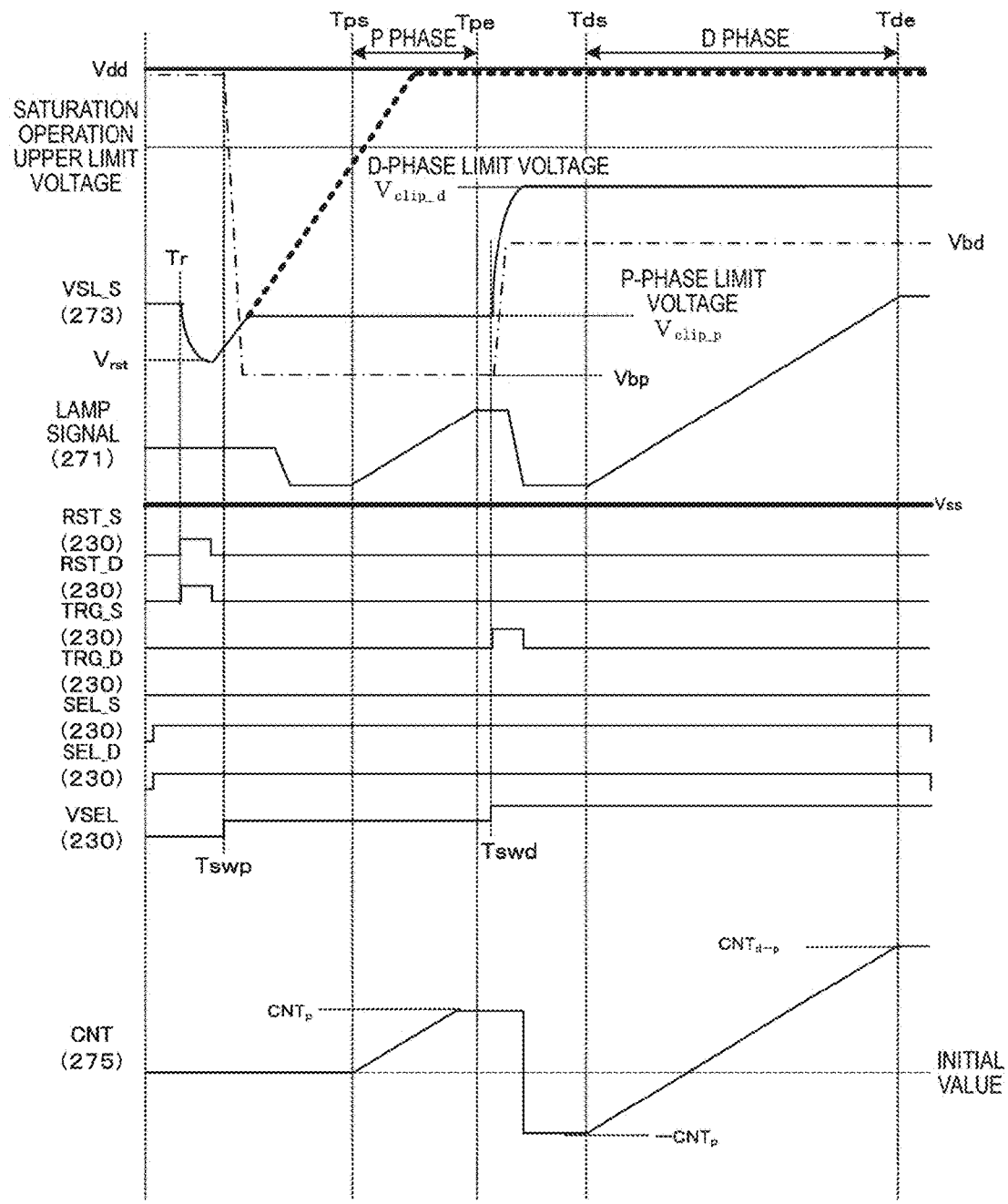
FIG. 12 is a timing chart showing an example of a driving operation of a pixel circuit according to the second modified example of the first embodiment of the present technology.

FIG. 12 is a timing chart showing an example of a driving operation of a pixel circuit according to the second modified example of the first embodiment. The dot-and-dash line in the drawing indicates a change of a voltage output by the selector 227.

The vertical scanning circuit 230 changes a voltage output by the selector 227 from the power source voltage Vdd to the bias voltage Vbp using the select signal VSEL at a timing Tswp before readout of the P-phase level. Then, the vertical scanning circuit 230 changes the voltage output by the selector 227 to the bias voltage Vbd using the select signal VSEL at a timing Tswd before readout of the D-phase level.

As described above, according to the second modified example of the first embodiment of the present technology, the bypass control unit 220 limits an output voltage to two different limit voltages by applying two different bias voltages, and thus limitation using the two limit voltages can be realized with no resistive elements provided.

<2. Second Embodiment>

Although the dummy pixel circuits 260 are only disposed in the M-th row in the above-described first embodiment, a distance between the effective pixel circuit 250 in a row other than M−1-th row and the dummy pixel circuit 260 is distant in this disposition. Unevenness in characteristics of elements installed in a differential amplifier circuit in which the effective pixel circuits 250 and the dummy pixel circuits 260 are not in proximity to each other is more significant than that in a case in which the effective pixel circuits 250 and the dummy pixel circuits 260 are in proximity to each other, which can be a source of noise found in image data. For this reason, it is desirable to dispose the dummy pixel circuits 260 at positions in proximity to the effective pixel circuits 250 in terms of a reduction of noise. A solid-state image sensor 200 of a second embodiment is different from that of the first embodiment in that dummy pixel circuits are disposed in proximity to effective pixel circuits.

Figure 13:
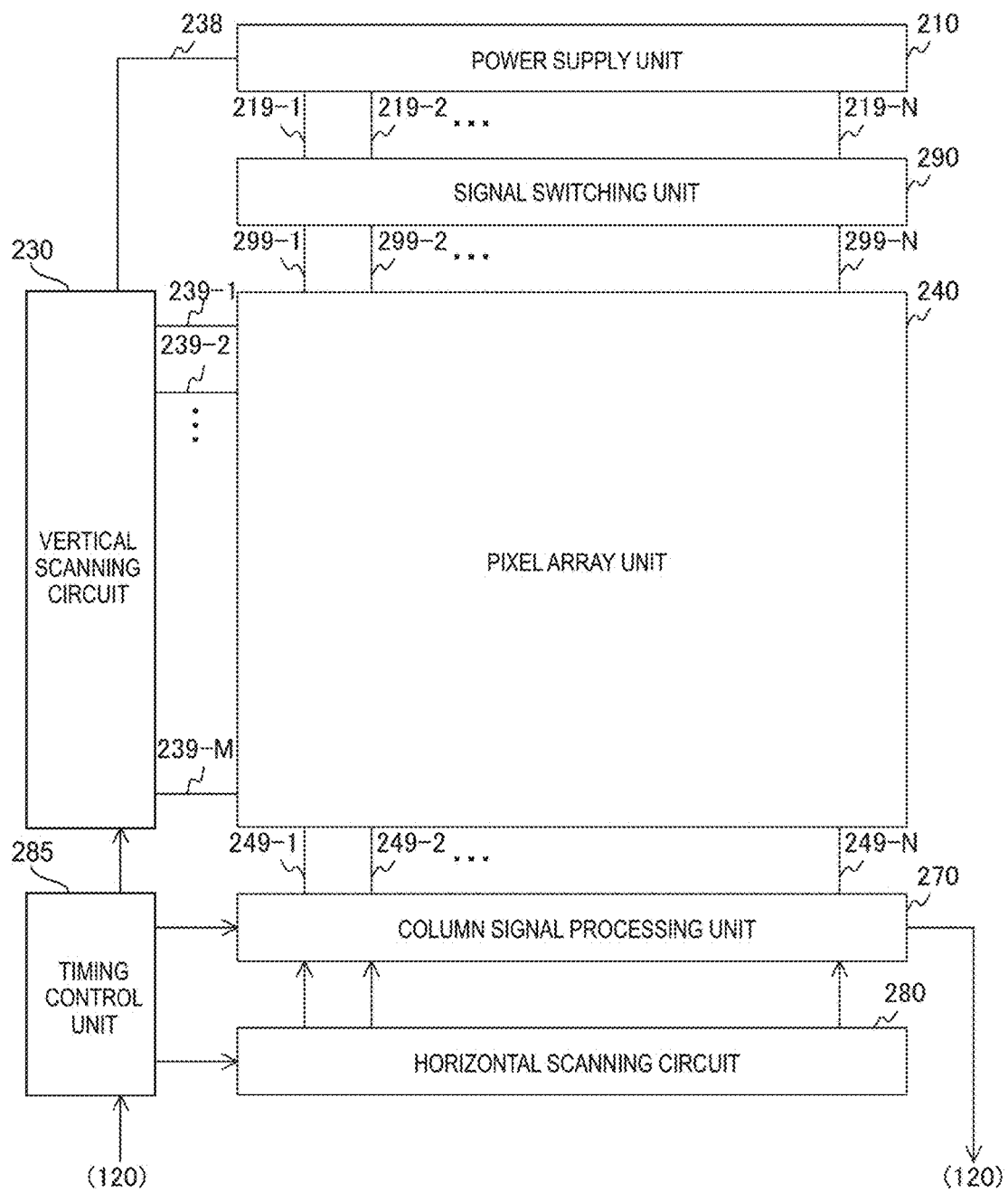
FIG. 13 is a block diagram illustrating an example of a configuration of a solid-state image sensor according to a second embodiment of the present technology.

FIG. 13 is a block diagram illustrating an example of a configuration of the solid-state image sensor 200 according to the second embodiment. The solid-state image sensor 200 according to the second embodiment is different from that of the first embodiment in that a signal switching unit 290 is further included.

Figure 14:
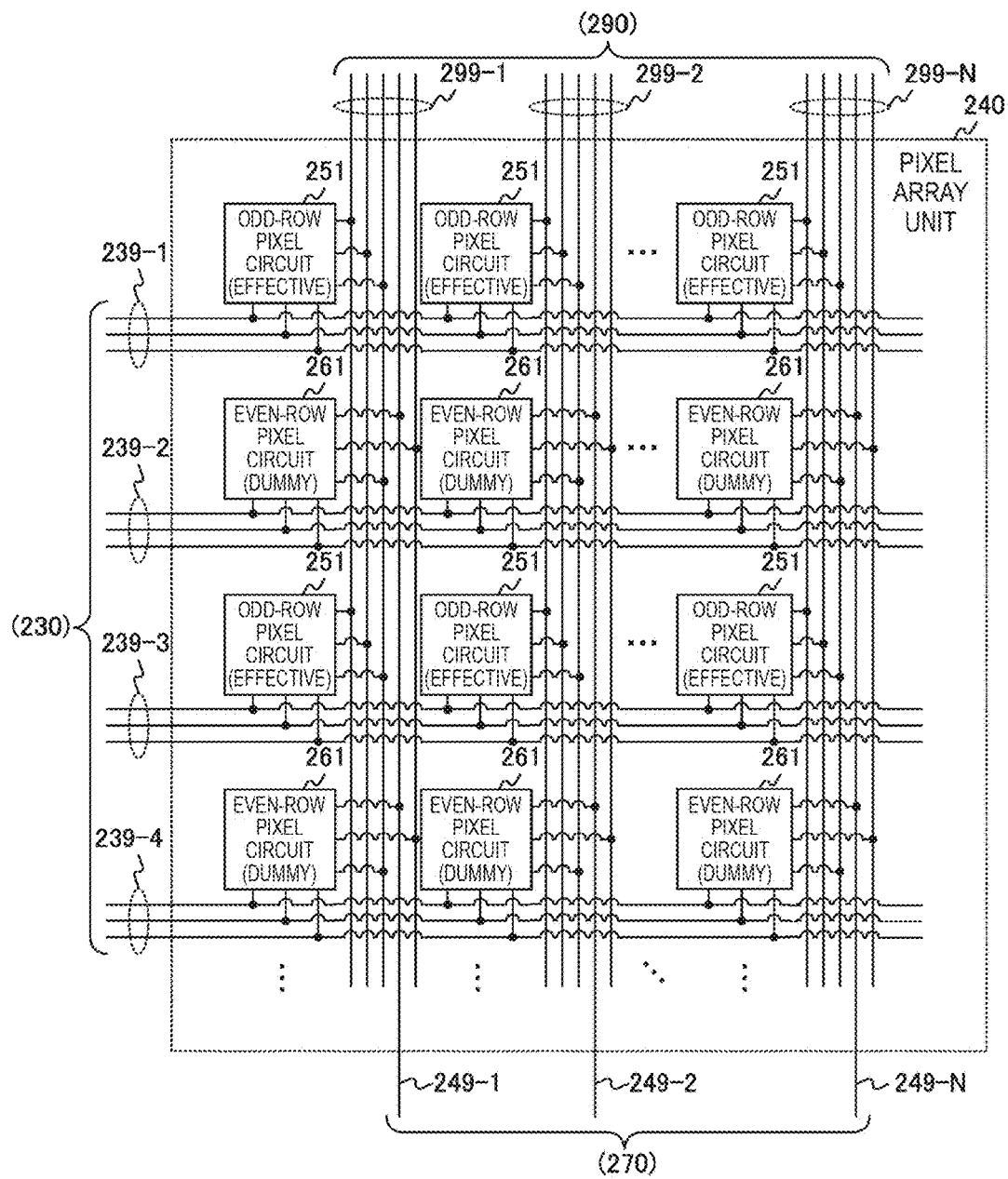
FIG. 14 is a block diagram illustrating an example of a configuration of a pixel array unit according to the second embodiment of the present technology.

FIG. 14 is a block diagram illustrating an example of a configuration of a pixel array unit 240 according to the second embodiment. The pixel array unit 240 according to the second embodiment has odd-row pixel circuits 251 disposed in the odd rows and even-row pixel circuits 261 disposed in the even rows thereof. All these pixel circuits are not shielded from light.

The odd-row pixel circuits 251 are effective pixel circuits of which signals are red by the column signal processing unit 270. On the other hand, the even-row pixel circuits 261 are dummy pixel circuits of which no signals are read.

Note that, although the effective pixels and the dummy pixels are disposed in every other rows in an alternating manner, a configuration is not limited thereto as long as effective pixels are dummy pixels are in proximity to each other. For example, effective pixels may be disposed in 4k-th and 4k+3-th (k is an integer) rows, and dummy pixels may be disposed in 4k+1-th and 4k+2-th rows.

Figure 15:
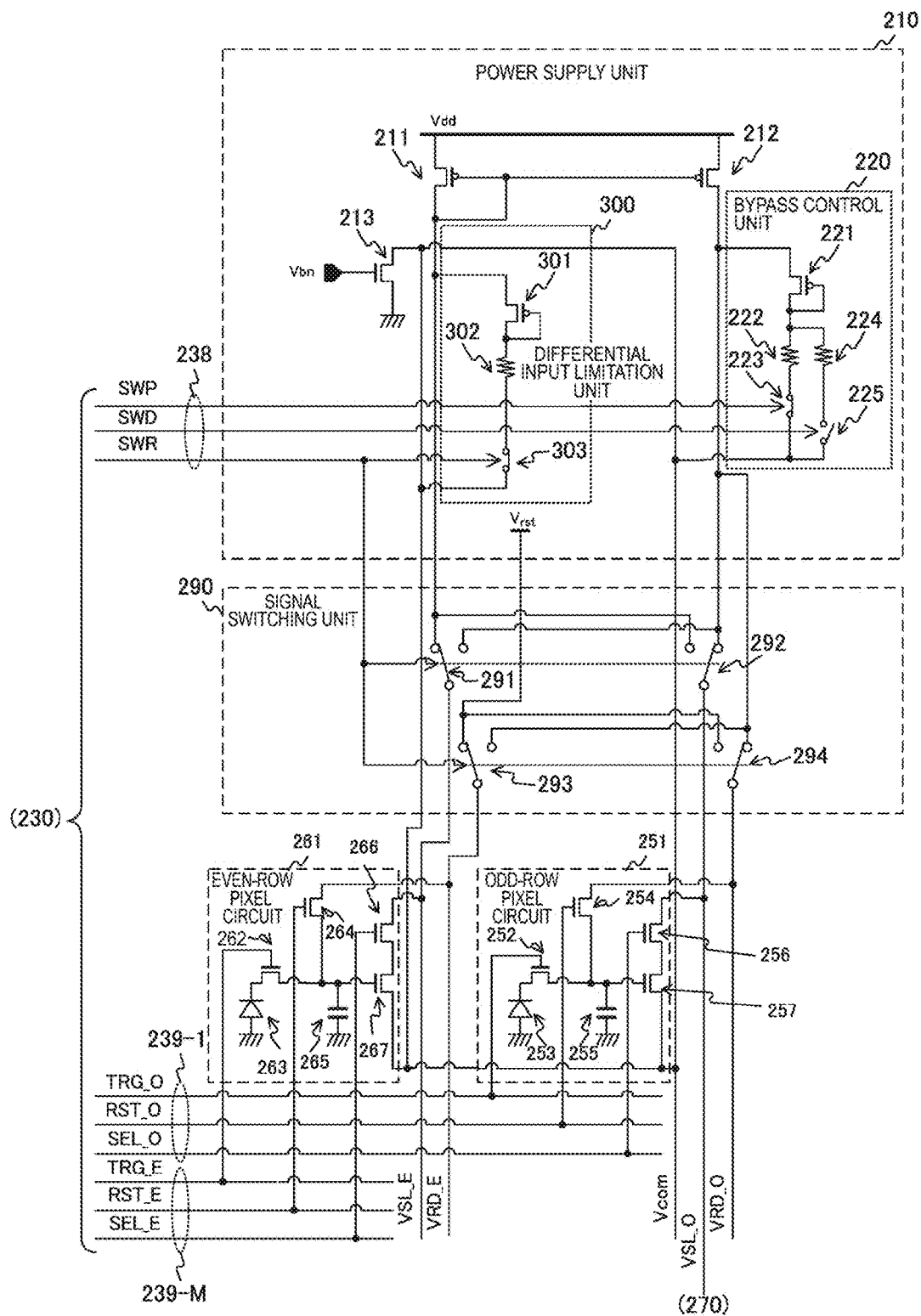
FIG. 15 is a circuit diagram illustrating an example of a configuration of a differential amplifier circuit according to the second embodiment of the present technology.

FIG. 15 is a circuit diagram illustrating an example of a configuration of a differential amplifier circuit according to the second embodiment. A power supply unit 210 of the second embodiment is different from that of the first embodiment in that a differential input limitation unit 300 is further included therein.

The differential input limitation unit 300 limits an output voltage of a signal line VSL_E on an even-row pixel circuit 261 (a dummy pixel) side to a limit voltage or lower. An output voltage of the dummy side (i.e., one of a pair of differential output voltages) is limited to, for example, a voltage having the same level as a limit voltage $V_{clip\_p}$ with respect to a P-phase level of the other (Vo) of the pair of differential output voltages or lower. The differential input limitation unit 300 includes a P-type transistor 301, a resistive element 302, and a switch 303.

The P-type transistor is in a diode connection and is inserted between a source of another P-type transistor 211 and the resistive element 302. The switch 303 opens and closes a path connecting the resistive element 302 and a constant current source 213 in accordance with a switching signal SWR.

In addition, the signal switching unit 290 includes switches 291, 292, 293 and 294. The switch 291 switches a connection destination of a drain of a select transistor 266 to one of the P-type transistor 211 and a P-type transistor 212 in accordance with the select signal SWR. The switch 292 switches a connection destination of a drain of a select transistor 256 to one of the P-type transistor 211 and the P-type transistor 212 in accordance with the select signal SWR.

The switch 293 switches a connection destination of a drain of a reset transistor 264 to one of a power source of a reset voltage $V_{rst}$ and the P-type transistor 212 in accordance with the select signal SWR. The switch 294 switches a connection destination of a drain of a reset transistor 254 to one of a power source of a reset voltage $V_{rst}$ and the P-type transistor 212 in accordance with the select signal SWR.

The vertical scanning circuit 230 performs control such that the switch 303 enters into a closed state in accordance with the select signal SWR in a case in which the pixels in the odd rows are driven, a connection destination of the select transistor 266 directs to the P-type transistor 211, and a connection destination of the select transistor 256 directs to the P-type transistor 212. In addition, the vertical scanning circuit 230 performs control such that a connection destination of the reset transistor 264 directs to the reset voltage $V_{rst}$ and a connection destination of the reset transistor 254 directs to the P-type transistor 212 during driving of the pixels in the odd rows. This control makes the connection configuration of the differential amplifier circuit similar to that of the first embodiment.

On the other hand, the vertical scanning circuit 230 performs control such that the switch 303 enters into an open state in accordance with the select signal SWR in a case in which the pixels in the even rows are driven, a connection destination of the select transistor 266 directs to the P-type transistor 212, and a connection destination of the select transistor 256 directs to the P-type transistor 211. In addition, the vertical scanning circuit 230 performs control such that a connection destination of the reset transistor 264 directs to the P-type transistor 212 and a connection destination of the reset transistor 254 directs to the reset voltage $V_{rst}$ during driving of the pixels in the even rows. This control makes the connection destinations of the select transistors and the reset transistors in the odd rows and the connection destinations of the select transistors and the reset transistors in the even rows alternate.

Furthermore, the odd-row pixel circuit 251 is controlled in accordance with a transfer signal TRG_O, a reset signal RST_O, and a select signal SEL_O, and the even-row pixel circuit 261 is controlled in accordance with a transfer signal TRG_E, a reset signal RST_E, and a select signal SEL_E.

Figure 16:
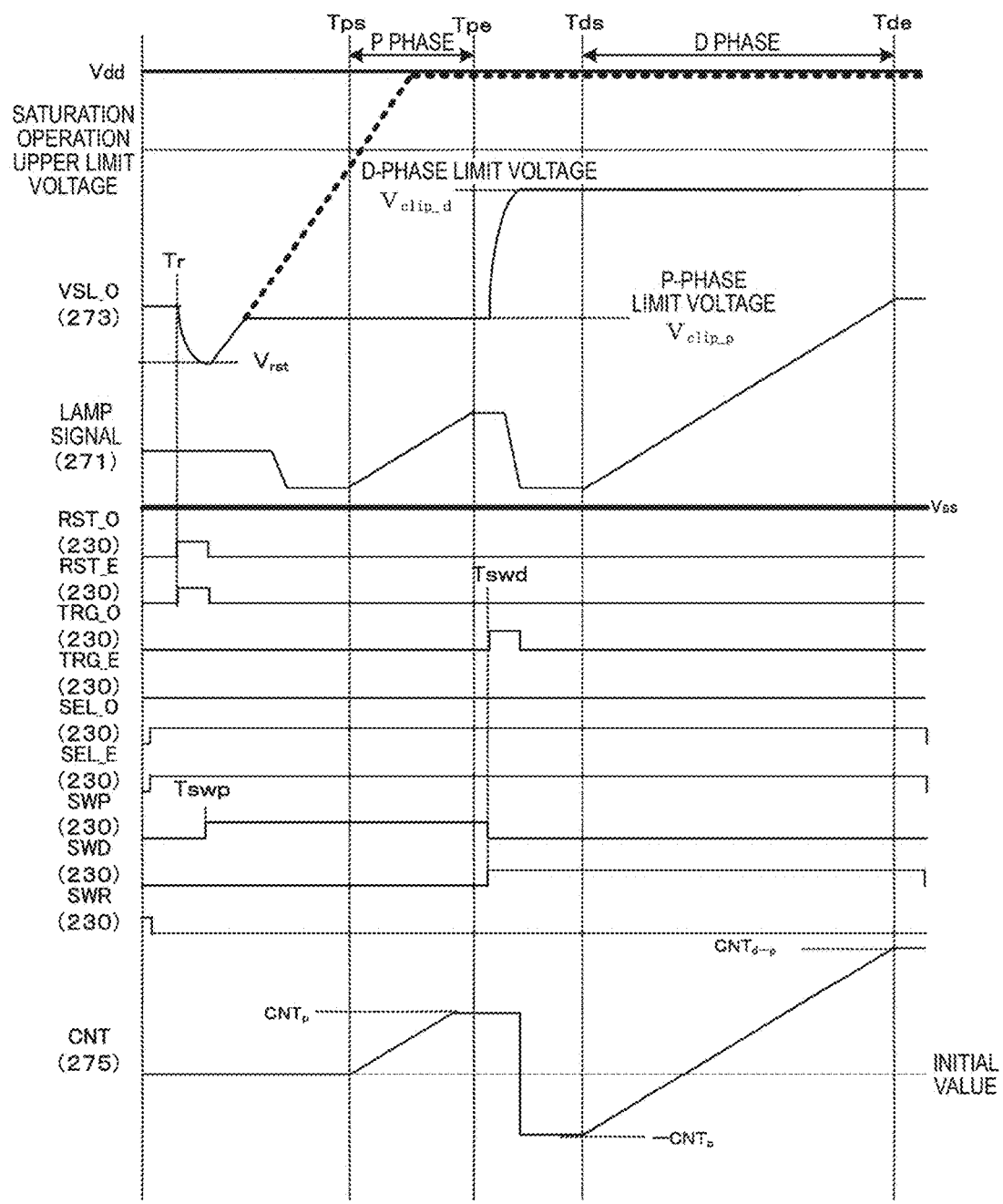
FIG. 16 is a timing chart showing an example of a driving operation of odd-row pixel circuits according to the second embodiment of the present technology.

FIG. 16 is a timing chart showing an example of a driving operation of the odd-row pixel circuits 251 according to the second embodiment. The vertical scanning circuit 230 sets the switch 303 to be in the closed state using the switching signal SWR set to be a low level to cause the connection configuration of the differential amplifier circuit to be similar to that of the first embodiment when the pixels in the odd rows are driven. Due to the switch 303 set to be in the closed state, a level of the signal line VSL_E of the dummy pixels (in the even rows) is limited to the limit voltage with respect to the P-phase level of the effective pixels (in the odd rows) or lower. Limiting the voltage of the signal line VSL_E on the dummy side described above is because the dummy pixels are not shielded from light. The reason for not shielding the dummy pixels from light is that it is difficult to shield only the dummy pixels from light in the above-described configuration in which the dummy pixels and the effective pixels are arrayed in an alternating manner.

Transmission timings of the transfer signal TRG_O, the reset signal RST_O, and the select signal SEL_O for the odd rows are similar to those of the effective pixels of the first embodiment. Transmission timings of the transfer signal TRG_O, the reset signal RST_O, and the select signal SEL_O for the even-rows are similar to those of the dummy pixels of the first embodiment.

Figure 17:
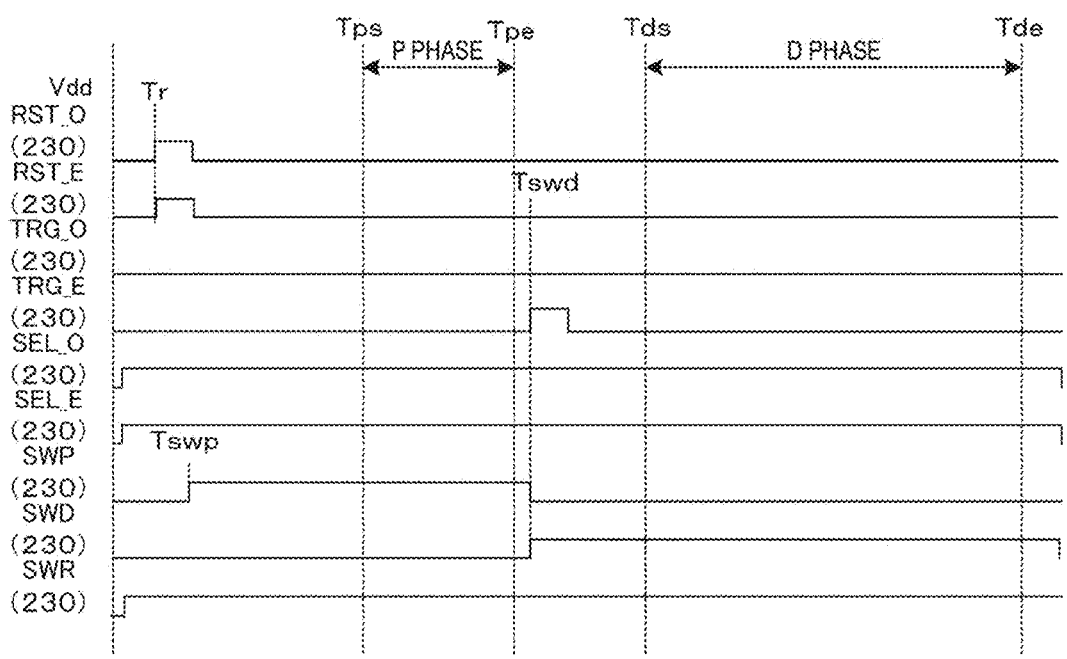
FIG. 17 is a timing chart showing an example of a driving operation of even-row pixel circuits according to the second embodiment of the present technology.

FIG. 17 is a timing chart showing an example of a driving operation of the even-row pixel circuits 261 according to the second embodiment. The vertical scanning circuit 230 causes the connection destinations of the select transistors and the reset transistors to switch to each other using the switching signal SWR set to be a high level. In addition, the vertical scanning circuit 230 sets only the transfer signal TRG_E for the odd rows to be a high level through a pulse period from a transfer timing Tswd immediately before readout of a D-phase level.

As described above, since the effective pixels and the dummy pixels are arranged in proximity to each other in an alternating manner according to the second embodiment of the present technology, unevenness in element characteristics can be decreased and thus noise can be reduced in comparison to the first embodiment in which there are effective pixels not in proximity to the dummy pixels.

In addition, the above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

Meanwhile, the effects described herein are not necessarily limited and may be effects described in the present disclosure.

Additionally, the present technology may also be configured as below.

(1)

A solid-state image sensor including:

a signal-side amplifier transistor configured to generate an output voltage corresponding to a signal current corresponding to one of a pair of differential input voltages by supplying the signal current from an output node to a common-phase node;

a reference-side amplifier transistor configured to supply a reference current corresponding to the other one of the pair of differential input voltages to the common-phase node;

a constant current source configured to constantly control a sum of the signal current and the reference current to be merged at the common-phase node; and a bypass control unit configured to connect the output node and the common-phase node and supply the signal current having a value corresponding to a predetermined limit voltage to the common-phase node in a case in which the output voltage reaches the limit voltage.

(2)

The solid-state image sensor according to (1), further including:

a signal processing unit configured to perform predetermined signal processing by reading a signal from an effective pixel circuit among the effective pixel circuit and a dummy pixel circuit, in which the signal-side amplifier transistor is disposed in the effective pixel circuit, and the reference-side amplifier transistor is disposed in the dummy pixel circuit.

(3)

The solid-state image sensor according to (2), in which the dummy pixel circuit is shielded from light.

(4)

The solid-state image sensor according to (2), in which the dummy pixel circuit is not shielded from light and is disposed in proximity to the effective pixel circuit.

(5)

The solid-state image sensor according to any of (1) to (4), in which the bypass control unit includes a bypass transistor having a source connected to the output node.

(6)

The solid-state image sensor according to (5), in which the signal-side amplifier transistor outputs a P-phase level as the output voltage and then outputs a D-phase level that is different from the P-phase level as the output voltage, and the limit voltage includes a P-phase limit voltage that limits the P-phase level and a D-phase limit voltage that limits the D-phase level.

(7)

The solid-state image sensor according to (6), in which the bypass control unit further includes first and second resistive elements connected to the bypass transistor in parallel, a gate and a drain of the bypass transistor are short-circuited, and a resistance value of the first resistive element is a value corresponding to the P-phase limit voltage, and a resistance value of the second resistive element is a value corresponding to the D-phase limit voltage.

(8)

The solid-state image sensor according to (6), in which the bypass transistor includes first and second bypass transistors having different threshold voltages, gates and drains of the first and second bypass transistors are short-circuited, and a threshold voltage of the first bypass transistor is a value corresponding to the P-phase limit voltage, and a threshold voltage of the second bypass transistor is a value corresponding to the D-phase limit voltage.

(9)

The solid-state image sensor according to (6), in which the bypass control unit further includes a selector configured to select one of a power source voltage and first and second bias voltages that are different from each other and supplies the selected voltage to a gate of the bypass transistor, and the first bias voltage is a value corresponding to the P-phase limit voltage, and the second bias voltage is a value corresponding to the D-phase limit voltage.

(10)

An electronic apparatus including:

a signal-side amplifier transistor configured to generate an output voltage corresponding to a signal current corresponding to one of a pair of differential input voltages by supplying the signal current from an output node to a common-phase node;

a reference-side amplifier transistor configured to supply a reference current corresponding to the other one of the pair of differential input voltages to the common-phase node;

a constant current source configured to constantly control a sum of the signal current and the reference current to be merged at the common-phase node;

a bypass control unit configured to connect the output node and the common-phase node and supply the signal current having a value corresponding to a predetermined limit voltage to the common-phase node in a case in which the output voltage reaches the limit voltage; and an image processing unit configured to perform predetermined image processing on image data generated from a signal of the output voltage.

(11)

A control method of a solid-state image sensor, the control method including:

an output voltage generation step of generating an output voltage by a differential amplifier circuit that includes a signal-side amplifier transistor configured to generate the output voltage corresponding to a signal current corresponding to one of a pair of differential input voltages by supplying the signal current from an output node to a common-phase node, a reference-side amplifier transistor configured to supply a reference current corresponding to the other one of the pair of differential input voltages to the common-phase node, and a constant current source configured to constantly control a sum of the signal current and the reference current to be merged at the common-phase node; and a bypass control step of connecting the output node and the common-phase node and supplying the signal current having a value corresponding to a predetermined limit voltage to the common-phase node in a case in which the output voltage reaches the limit voltage.

REFERENCE SIGNS LIST 100 electronic apparatus
110 imaging lens
120 digital signal processor
130 frame memory
140 recording device
150 display device
160 power supply circuit
170 operation circuit
180 bus
200 solid-state image sensor
210 power supply unit
211, 212, 301 P-type transistor
213 constant current source
220 bypass control unit
221, 226 bypass transistor
222, 224, 302 resistive element
223, 225, 291, 292, 293, 294, 303 switch
227 selector
230 vertical scanning circuit
240 pixel array unit
250 effective pixel circuit
251 odd-row pixel circuit
252, 262 transfer transistor
253, 263 photodiode
254, 264 reset transistor
255, 265 floating diffusion layer
256, 266 select transistor
257, 267 amplifier transistor
260 dummy pixel circuit
261 even-row pixel circuit
270 column signal processing unit
271 lamp signal generation circuit
272, 273 capacitor
274 comparator
275 counter
276 data holding unit
280 horizontal scanning circuit
285 timing control unit
290 signal switching unit
300 differential input limitation unit

The invention claimed is:

1. An imaging device comprising:

a differential amplifier comprising a first amplification transistor, a second amplification transistor, and a first current mirror transistor coupled to the first amplification transistor;

a plurality of pixels including a first pixel and a second pixel, wherein the first pixel includes a first photoelectric converter, a first reset transistor, and the first amplification transistor, and the second pixel includes a second photoelectric converter, a second reset transistor, and the second amplification transistor; and a clipping circuit coupled between a first terminal of the first current mirror transistor and a first terminal of the first amplification transistor, wherein the clipping circuit comprises a clipping transistor, a first resistor, a second resistor, a first switch, and a second switch, wherein a first terminal of the clipping transistor is coupled to the first terminal of the first current mirror transistor, wherein the first resistor and the first switch are arranged in series between a second terminal of the clipping transistor and the first terminal of the first amplification transistor, wherein the second resistor and the second switch are arranged in series between the second terminal of the clipping transistor and the first terminal of the first amplification transistor.

2. The imaging device according to claim 1, wherein the differential amplifier further comprises a second current mirror transistor coupled to the second amplification transistor.

3. The imaging device according to claim 1, wherein the first pixel further includes a select transistor coupled between the first terminal of the first current mirror transistor and a second terminal of the first amplification transistor.

4. The imaging device according to claim 1, wherein the first reset transistor is coupled to a first reset voltage, and
wherein the second reset transistor is coupled to a second reset voltage different than the first reset voltage.

5. The imaging device according to claim 1, wherein the first pixel further comprises a floating diffusion, and
wherein the first reset transistor is coupled between the first terminal of the first current mirror transistor and the floating diffusion.

6. The imaging device according to claim 1, wherein the first amplification transistor and the second amplification transistor are coupled to a current source.

7. The imaging device according to claim 1, wherein the differential amplifier further comprises a plurality of switches including a third switch and a fourth switch.

8. The imaging device according to claim 7, wherein the third switch is coupled to the first reset transistor and the fourth switch is coupled to the second reset transistor.

9. The imaging device according to claim 8, wherein the third switch is arranged to selectively couple the first reset transistor to a first voltage or a second voltage different from the first voltage.

10. The imaging device according to claim 9, wherein the fourth switch is arranged to selectively couple the second reset transistor to the first voltage or the second voltage.

11. The imaging device according to claim 8, wherein the plurality of switches comprises a fifth switch coupled to the first amplification transistor and a sixth switch coupled to the second amplification transistor.

12. The imaging device according to claim 11, wherein the fifth switch is arranged to selectively couple the first amplification transistor to a first voltage or a second voltage different from the first voltage.

13. The imaging device according to claim 12, wherein the sixth switch is arranged to selectively couple the second amplification transistor to the first voltage or the second voltage.

14. The imaging device according to claim 1, wherein the plurality of pixels are arranged in an array of rows and columns, and
wherein first pixel and the second pixel are located in different rows of the array.

15. An electronic device comprising:
an imaging device, comprising:
a differential amplifier comprising a first amplification transistor, a second amplification transistor, and a first current mirror transistor coupled to the first amplification transistor;
a plurality of pixels including a first pixel and a second pixel, wherein the first pixel includes a first photoelectric converter, a first reset transistor, and the first amplification transistor, and the second pixel includes a second photoelectric converter, a second reset transistor, and the second amplification transistor; and
a clipping transistor coupled between a first terminal of the first current mirror transistor and a first terminal of the first amplification transistor, wherein the clipping circuit comprises a clipping transistor, a first resistor, a second resistor, a first switch, and a second switch,
wherein a first terminal of the clipping transistor is coupled to the first terminal of the first current mirror transistor,
wherein the first resistor and the first switch are arranged in series between a second terminal of the clipping transistor and the first terminal of the first amplification transistor, wherein the second resistor and the second switch are arranged in series between the second terminal of the clipping transistor and the first terminal of the first amplification transistor.

16. The electronic device according to claim 15, wherein the differential amplifier further comprises a second current mirror transistor coupled to the second amplification transistor.

17. The electronic device according to claim 15, wherein the first pixel further includes a select transistor coupled between the first terminal of the first current mirror transistor and a second terminal of the first amplification transistor.

18. The electronic device according to claim 15, wherein the first reset transistor is coupled to a first reset voltage, and
wherein the second reset transistor is coupled to a second reset voltage different than the first reset voltage.

19. The electronic device according to claim 15, wherein the first pixel further comprises a floating diffusion, and
wherein the first reset transistor is coupled between the first terminal of the first current mirror transistor and the floating diffusion.

20. The electronic device according to claim 15, wherein the first amplification transistor and the second amplification transistor are coupled to a current source.

21. The electronic device according to claim 15, wherein the differential amplifier further comprises a plurality of switches including a third switch and a fourth switch.

22. The electronic device according to claim 21, wherein the third switch is coupled to the first reset transistor and the second switch is coupled to the second reset transistor.

23. The electronic device according to claim 22, wherein the third switch is arranged to selectively couple the first reset transistor to a first voltage or a second voltage different from the first voltage.

24. The electronic device according to claim 23, wherein the fourth switch is arranged to selectively couple the second reset transistor to the first voltage or the second voltage.

25. The electronic device according to claim 23, wherein the plurality of switches comprises a fifth switch coupled to the first amplification transistor and a sixth switch coupled to the second amplification transistor.

26. The electronic device according to claim 25, wherein the fifth switch is arranged to selectively couple the first amplification transistor to a first voltage or a second voltage different from the first voltage.

27. The electronic device according to claim 26, wherein the sixth switch is arranged to selectively couple the second amplification transistor to the first voltage or the second voltage.

28. The electronic device according to claim 15, wherein the plurality of pixels are arranged in an array of rows and columns, and
wherein first pixel and the second pixel are located in different rows of the array.

* * * * *